United States Patent [19]

Sakaida et al.

[11] Patent Number: 5,147,141
[45] Date of Patent: Sep. 15, 1992

[54] DRIVER CIRCUIT FOR PIEZOELECTRIC ACTUATOR, AND DOT-MATRIX HEAD AND PRINTER USING PIEZOELECTRIC OR OTHER ACTUATOR HAVING DISCHARGE CONTROL MEANS

[75] Inventors: Atsuo Sakaida, Gifu; Yoshiyuki Ikezaki, Nagoya; Akira Iriguchi, Nagoya; Takeshi Niikawa, Nagoya; Masashi Suzuki, Nagoya, all of Japan

[73] Assignee: Brother Kogyo Kabushiki Kaisha, Nagoya, Japan

[21] Appl. No.: 426,773

[22] Filed: Oct. 26, 1989

[30] Foreign Application Priority Data

Oct. 28, 1988 [JP] Japan .................................. 63-273921
Nov. 12, 1988 [JP] Japan .................................. 63-286210
May 16, 1989 [JP] Japan ................................... 1-121841

[51] Int. Cl.[5] ............................................... B41J 2/95
[52] U.S. Cl. ..................................... 400/124; 400/157.3
[58] Field of Search ................... 400/157.2, 385, 389, 400/124 PZ, 124, 157.3

[56] References Cited

U.S. PATENT DOCUMENTS

| | | | |
|---|---|---|---|
| 4,262,592 | 4/1981 | Araki | 400/157.3 |
| 4,348,119 | 9/1982 | Carson, Jr. et al. | 400/157.2 |
| 4,595,854 | 6/1986 | Yano et al. | 310/117 |
| 4,850,724 | 7/1989 | Fattori | 400/157.2 |

FOREIGN PATENT DOCUMENTS

| | | | |
|---|---|---|---|
| 120465 | 7/1984 | Japan | 400/124 PZ |
| 59-45209 | 11/1984 | Japan . | |
| 62-122761 | 11/1987 | Japan . | |
| 63-130357 | 10/1988 | Japan . | |
| 63-130358 | 10/1988 | Japan . | |
| 2198604 | 6/1988 | United Kingdom | 400/124 PZ |
| 2201379 | 9/1988 | United Kingdom | 400/129 PZ |

OTHER PUBLICATIONS

IBM Technical Disclosure Bulletin, vol. 27, No. 12, May 1985, "Electronic Print Hammer Damping".

Primary Examiner—Edgar S. Burr
Assistant Examiner—John S. Hilten
Attorney, Agent, or Firm—Oliff & Berridge

[57] ABSTRACT

A driver circuit for driving a piezoelectric element, including a charging circuit having a DC power source and a coil for charging the piezoelectric element, and a discharging circuit for discharging the piezoelectric element. When the piezoelectric element is charged, a first switching device in the charging circuit is held on until a voltage of the element reaches a predetermined level below a line voltage of the power source. A second switching device provided in the discharging circuit is turned on at the time when the first switching device is turned off or at a predetermined later time, and is turned off by the time when said first switching device is again turned on next activation of the piezoelectric element. A voltage limiter inhibits the voltage of the piezoelectric element element from exceeding the predetermined level. The driver circuit may be used for a dot-matrix printer, which may be adapted to discharge the piezoelectric element for a comparatively long time where a distance between adjacent two dots to be formed is larger than a predetermined value.

20 Claims, 12 Drawing Sheets

DRIVER CIRCUIT FOR PIEZOELECTRIC ACTUATOR, AND DOT-MATRIX HEAD AND PRINTER USING PIEZOELECTRIC OR OTHER ACTUATOR HAVING DISCHARGE CONTROL MEANS

BACKGROUND OF THE INVENTION

1. Field of the Invention

The present invention relates in general to a driver circuit for a piezoelectric actuator, and a dot-matrix print head and a dot-matrix printer utilizing a piezoelectric actuator, and more particularly to a technique for controlling displacement of the piezoelectric actuator. The invention is also concerned with a dot-matrix printer using a print wire activated by a piezoelectric or other actuator, and more particularly with a technique for preventing unintended formation of dots due to a rebounding motion of the print wire which may be caused by a return movement of the wire from the advanced printing position back to the fully retracted position.

2. Discussion of the Related Art

A piezoelectric element oscillates at a given frequency when alternately charged and discharged together with a coil. In some applications of the piezoelectric element, it is required that the piezoelectric element be held in the same displaced state for more than a predetermined time duration. For example, this requirement should be satisfied when the piezoelectric element is used as an actuator for operating a print wire of a print head for a dot-matrix impact printer.

In view of the above requirement, the assignee of the present invention developed a driver circuit for a piezoelectric element, which is adapted to hold the piezoelectric element in a predetermined operating position for a sufficiently long time, without deteriorating the operating response. This driver circuit is disclosed in Japanese Patent Application No. 63-114397. An example of the driver circuit as disclosed in this document is illustrated in FIG. 16, in which a DC power source E, a first transistor TR1, a coil L and a piezoelectric element P are connected in series to each other. The negative terminals of the DC power source E and the piezoelectric element P are both grounded. The transistor TR1 allows an electric current to flow therethrough in the direction from the positive terminal of the power source E toward the positive terminal of the piezoelectric element P. This direction of the current flow will be referred to as "forward direction" of the circuit when appropriate. The positive terminal of the piezoelectric element P is also ground through a resistor R and a second transistor TR2. The second transistor TR2 allows an electric current to flow therethrough in the direction from the resistor R toward the ground.

The first and second transistors TR1, TR2 are turned on and off by a transistor controller TC. These transistors TR1, TR2 are normally placed in the off state. When the controller TC receives a drive command to drive the piezoelectric element P, the controller TC turns on the first transistor TR1. As a result, an electric energy is transferred from the DC power source E to the piezoelectric element P via the first transistor TR1 and the coil L, whereby the piezoelectric element is charged while oscillating with the coil L. Consequently, a voltage $V_P$ of the piezoelectric element P begins to rise from zero, as indicated in solid line in the graph of FIG. 17. The controller TC turns off the first transistor TR1 or returns the transistor TR1 to its original off state, when a predetermined time $T_C$ has passed after the beginning of charging of the element P. This time $T_C$ is equal to or longer than a half of a nominal activation cycle time of the element P which corresponds to the oscillation frequency determined by a product of the equivalent capacitance of the element P and the reactance of the coil L. Accordingly, the voltage $V_P$ of the piezoelectric element P reaches a peak level which is about two times as high as a line voltage $V_E$ of the power source E. Namely, the charging of the element P is completed when the voltage $V_P$ reaches the peak level indicated above. Even if the frist transistor TR1 remains on after the piezoelectric element P is completely charged, the discharging of the element P is prevented and the voltage $V_P$ is held constant, because the transistor TR1 does not allow an electric current to flow in the direction opposite to the forward direction, i.e., inhibits a flow of the current in the reverse direction from the element P toward the power source E. The time TC indicated in FIG. 17 is referred to as "charging time" during which the first transistor TR1 is held in the on state to charge the piezoelectric element P. After the charging time $T_C$ expires, the first transistor TR1 placed in the off state inhibits both the charging and the discharging of the element P, whereby the voltage $V_P$ can be maintained at the same level (peak level indicated above).

The transistor controller TC turns on the second transistor TR2 when a predetermined time has passed after the drive command is received. As a result, the electric energies stored in the piezoelectric element P and in the coil L are released and consumed by the resistor R. The controller TC returns the second transistor TR2 to its original off state at a point of time when the energies should have been completely consumed by the resistor R. A discharging time during which the second transistor TR2 is held on is indicated at $T_D$ in the graph of FIG. 17.

As is apparent from the above description, the driver circuit developed by the assignee of the present invention is capable of maintaining the maximum amount of displacement of the piezoelectric element P for a period from the moment of completion of the charging to the moment of commencement of the discharging, thereby enabling the piezoelectric element P to maintain a constant drive force so that the drive force acts on a subject to be driven, for a predetermined time equal to the period for which the element is held in its fully displaced state.

However, a continuing study of the present applicants revealed a following probler: with the driver circuit discussed above. Namely, the voltage $V_P$ of the piezoelectric element P is lowered as indicated in broken line in FIG. 17, due to consumption of the electric energy by the element P during working of the element P on the subject, since the element P in its fully displaced state is inhibited from being charged any longer. As a consequence, the amount of displacement of the piezoelectric element P is reduced and the resulting drive force is accordingly reduced.

Further, if the piezoelectric element P cannot be completely discharged in a given activation cycle for some reason or other, an electric energy may remain in the element P at the start of charging in the next activation cycle. In this case, the amplitude of oscillation of the coil L and the element P is reduced due to the remaining energy, and the voltage $V_P$ of the element P cannot reach the nominal peak level which is normally obtained when the element P is charged without an energy left therein. Thus, the piezoelectric element P does not produce the nominal drive force. Where the piezoelectric element P is used for activating a print head, for example, the piezoelectric element is alternately turned on and off in a repeated fashion for printing actions, and a sufficient time may not be given to allow the piezoelectric element P to be fully discharged. Moreover, the charging and discharging intervals may vary from time to time. In this situation, the piezoelectric element P may or may not have a residual energy when the charging of the element P is started. The amount of the residual energy may fluctuate. Accordingly, the maximum amount of displacement of the piezoelectric element or the operating position (i.e., fully displaced position) of the element varies from one activation cycle to another, whereby the drive force produced by the piezoelectric element P varies from time to time. To avoid this problem, the driver circuit discussed above must be adapted to provide a comparatively long time for discharging the piezoelectric element so that no residual energy is left prior to the charging in each activation cycle.

A dot-matrix impact printer utilizing a piezoelectric element as described above is generally constructed so as to include (a) a print head having a piezoelectric actuator to and from which an electric energy is applied and removed, and a print wire operated by the piezoelectric actuator, to form dots on a recording medium, (b) a feeding device for effecting a relative movement between the print head and the recording medium in a printing direction, (c) an actuator control device responsive to printing data, for controlling the piezoelectric actuator to move the print wire between a printing position in which the print wire is pressed against the recording medium to form a dot at one of predetermined printing positions which are spaced from each other at a predetermined pitch in the printing direction, and a non-printing or retracted position in which the print wire is spaced away from the recording medium. The print wire is moved to the printing position by one of the application and removal of an electric energy to and from the actuator, and is returned to the non-printing position by the other of the application and removal of the electric energy.

Generally, the piezoelectric type print head using a piezoelectric element or elements as an actuator incorporates a mechanism for amplifying an amount of displacement of the piezoelectric element to be transmitted to the print wire, so that the amount of movement of the print wire between the printing and non-printing positions is larger than the amount of displacement of the piezoelectric element. The non-printing position of the print wire is elastically defined or established by the displacement amplifying mechanism. For accurate establishment of the non-printing position of the print wire, the displacement amplifying means may be provided with a stop disposed adjacent to the print wire or a member which moves with the print wire, so that the non-operating or fully retracted position of the print wire is determined by abutting contact of the print wire with the stop. In the printer having this type of print head, the piezoelectric element is energized and deenergized in response to a drive command for activating the print head. Upon energization of the piezoelectric element by application of a voltage thereto, the piezoelectric element is displaced in a forward direction, to cause an advancing movement of the print wire from the non-printing position to the printing position, whereby the operating end of the print wire is pressed against a recording medium. When the piezoelectric element is deenergized by removal of the voltage therefrom, on the other hand, the piezoelectric element is displaced in a reverse direction, to retract the print wire away from the recording medium back to the non-printing position. It is possible that the print wire is biased toward the printing position by suitable biasing means such as a resilient member so that the print wire is retracted by applying a voltage to the piezoelectric element, and is advanced to the printing position under the biasing force of the biasing means by removing the voltage from the piezoelectric element.

The piezoelectric element may be replaced by other actuators such as a solenoid coil. A print head using a solenoid coil as an actuator for operating a print wire generally includes (a) an armature which is displaced according to a magnetic force produced by the solenoid coil and which is returned to an original position thereof upon deenergization of the solenoid coil, (b) a displacement transmitting mechanism for transmitting a displacement of the armature to the print wire, (c) a stop disposed adjacent to the print wire or a member which moves with the print wire, for defining the non-printing position of the print wire. In a printer having this type of print head, the solenoid coil is energized and deenergized in response to the drive command for activating the print wire. When the solenoid coil is energized, the armature is displaced in a forward direction, to advance the print wire from the non-printing position for forcing the print wire against the recording medium. When the coil is deenergized, the armature is returned in a reverse direction to retract the print wire away from the recording medium back to the non-printing position. Alternatively, the armature is biased in the forward direction by suitable biasing means, and the solenoid coil is energized to produce a magnetic force to attract the armature in the reverse direction against the biasing force of the biasing means and hold the armature at the original retracted position. Upon generation of the drive command, the solenoid coil is deenergized to allow the armature to be moved in the forward direction under the biasing force of the biasing means, thereby advancing the print wire to the printing position.

Since it is desired to effect a dot-matrix printing operation at a speed as high as possible, it is proposed to control a head driver circuit of the dot-matrix printer such that the application and removal of an electric energy to and from the print wire actuator such as the piezoelectric element or solenoid coil as discussed above are completed in time periods as short as possible. That is, it is proposed to reduce not only the wire advancing time necessary to advance the print wire from the non-printing position to the printing position for pressing contact with the recording medium, but also the wire retracting time necessary to retract the print wire from the printing position back to the non-printing position.

However, there is a limitation in shortening the wire retracting time. If the wire retracting time is too short, the speed of movement of the print wire approaching the non-printing position is so high that the force of abutting contact of the print wire with a stop at the non-printing position becomes excessively large, where the non-printing position is established by the stop. If the non-printing position is established without using a stop, the print wire overruns past the non-printing position. In either case, the print wire tends to rebound in the advancing direction, and may sometime reaches the printing position. For this reason, the discharging or deenergizing time of the piezoelectric element, solenoid coil or other actuator for the print wire should not exceed a certain limit, so as to prevent the print wire from undergoing an excessively large rebounding motion sufficient to effect printing of a dot, when the print wire is returned to the non-printing position upon discharging or deenergization of the print wire actuator. This is one of the factors that hinder an improvement in the printing speed of the dot-matrix printer.

SUMMARY OF THE INVENTION

It is therefore a first object of the present invention to provide a driver circuit for a piezoelectric element, which permits the piezoelectric element to maintain a desired drive force for a predetermined constant time duration.

A second object of the invention is to provide a print head having a piezoelectric actuator which is driven by a driver circuit as indicated above with respect to the first object.

A third object of the invention is to provide a dot-matrix printer having a print head as indicated above with respect to the second object.

A fourth object of the invention is to provide a dot-matrix printer which has a piezoelectric element, a solenoid coil or other actuator for activating a print wire, and which has an improved printing speed, without rebounding of the print wire.

The first object may be achieved according to one aspect of the present invention, which provides a driver circuit for driving a piezoelectric element, including a charging circuit having a DC power source and a coil which are connected in series to the piezoelectric element for charging the piezoelectric element, and a discharging circuit for allowing the piezoelectric element to be discharged, the driver circuit comprising first conditioning means provided in the charging circuit, second conditioning means provided in the discharging circuit, and voltage limiting means. The first conditioning means has an original state for inhibiting the piezoelectric element from being charged, and a charging state for allowing the piezoelectric element to be charged. The first conditioning means is normally placed in the original state, and brought into the charging state upon generation of a drive command to activate the piezoelectric element. The first conditioning means is returned to the original state at a first point of time a predetermined time after a voltage of the piezoelectric element has reached a predetermined level not higher than a line voltage of the power source. The second conditioning means has an original state for inhibiting the piezoelectric element from being discharged, and a discharging state for allowing the piezoelectric element to be discharged. The second conditioning means is normally placed in the original state thereof and is brought into the discharging state thereof at the above-indicated first point of time or a second point of time a predetermined time after the first point of time. The second conditioning means is returned to the original state thereof by the time when the first conditioning means is placed in the charging state thereof for a next activation of the piezoelectric element. The voltage limiting means is adapted to prevent the piezoelectric element from receiving an excessive electric energy that causes the voltage of the above-indicated piezoelectric element to exceed the predetermined level, and thereby limit the voltage of the piezoelectric element to this predetermined level.

In the driver circuit of the present invention constructed as described above, the charging of the piezoelectric element is started in response to the drive command, and the charging is stopped at the moment a suitable time after the voltage of the piezoelectric element has reached the predetermined level which is equal to or lower than the line voltage of the power source. During a period between the moment when the voltage of the piezoelectric element has reached the predetermined level and the moment when the charging is stopped, the amount of the energy consumed by the piezoelectric element is compensated for by a supplemental charging by an electric energy supplied from the power source. Further, the voltage is limited to the predetermined level by the voltage limiting means. Therefore, the voltage is held at the predetermined level during the period indicated above. When predetermined time has passed after the moment of reception of the drive command, the discharging of the piezoelectric element is started, to allow the element to return to the initial non-displaced state.

The present driver circuit permits the piezoelectric element to be charged to a constant peak level in all activation cycles of the piezoelectric element, irrespective of whether a residual electric energy left in the piezoelectric element or not, and irrespective of the amount of the residual energy, even if the charging of the element is commenced before the previous displacement of the element is completely zeroed, due to the residual energy left in the event that the discharging of the element cannot be normally effected in the preceding activation cycle.

Thus, the piezoelectric element is easily controlled so as to maintain a desired constant drive force for a predetermined constant time duratior.

Further, the maximum amount of displacement or the operating position of the piezoelectric element is made constant in all activation cycles, irrespective of whether an electric energy is left in the piezoelectric element prior to the charging, or not, and irrespective of the amount of the residual energy. Therefore, even if the piezoelectric element is not normally discharged due to an insufficient time for discharging the piezoelectric element during repetition of alternate charging and dischargin cycles, it is possible to effectively minimize the amount of a variation in the drive force produced by the piezoelectric element from one activation cycle to another.

It is desirable to prevent storage in the piezoelectric element an excessive amount of electric energy that causes the voltage of the element to exceed the predetermined level. To this end, it is possible, for example, to provide a resistor to consume the excessive cnergy, or return the excessive energy to the DC power source. In the latter case, the energy returned to the power source may be reused, reducing the required power consumption for activating the piezoelectric element.

The first conditioning means may comprise first switching means connected in series to the charging circuit, and first switch control means for controlling the first switching means in response to the drive command, while the second conditioning means may comprise second switching means connected in series to the discharging circuit, and second switching control means for controlling the switching means. In this case, the voltage limiting means may comprise a closed by-pass circuit which by-passes the first switching means and includes the DC power source, the coil, and checking means such as diodes connected in series to the power source and the coil. This checking means allows a flow of an electric current in a direction from the coil toward a positive terminal of the power source, and inhibiting a flow of the current in the opposite direction. Although the checking means such as the diodes of the voltage limiting means functions to limit the voltage of the piezoelectric element to the predetermined level not higher than the line voltage of the power source, the predetermined level established by the voltage limiting means may slightly exceed the line voltage, by an amount which is determined by the properties of diodes used as the checking means. More specifically, an amount of an electric current which flows through a diode in one direction from the coil toward the positive terminal of the power source begins to linearly increase after the voltage applied to the diode reaches a given level slightly higher than the line voltage of the power source. For this reason, the voltage at which the current begins to flow through the diode toward the positive terminal of the power source is slightly higher than the line voltage of the power source. In this respect, the predetermined level to which the voltage of the piezoelectric element is limited is slightly higher than the line voltage. However, the difference between these two levels is relatively small, and the predetermined level may be considered almost equal to the line voltage.

The second object of the invention may be attained according to another aspect of the invention, which provides a print head comprising a piezoelectric actuator consisting of a plurality of piezoelectric elements superposed on each other, and a print wire activated by the piezoelectric actuator to effect printing due to pressing contact of the print wire with a recording medium. The piezoelectric elements are driven by a driver circuit constructed as described above with respect to the first object of the invention.

The third object of the invention may be accomplished according to a further aspect of the invention, which provides a dot-matrix printer comprising a print head constructed as described above with respect to the second object of the invention.

The fourth object may be achieved according to a still further aspect of the present invention, which provides a dot-matrix printer comprising a print head having an actuator such as a piezoelectric element and a solenoid coil for operating a print wire by application and removal of an electric energy to and from the actuator, to form dots on a recording medium, a feeding device for effecting a relative movement between the print head and the recording medium, an actuator control device responsive to printing data for controlling the actuator, and discharge control means for controlling the actuator control device. The actuator control device controls the actuator to move the print wire between a printing position in which the print wire is pressed against the recording medium to form a dot at one of predetermined printing positions which are spaced apart from each other at a predetermined pitch in a direction of the relative movement of the print head and the medium, and a non-printing position in which the print wire is spaced away from the recording medium. The print wire is moved to the printing position by one of application and removal of an electric energy to and from the actuator, and returned to the non-printing position by the other of the application and the removal of the electric energy. The discharge control means is adapted to control the actuator control device such that a length of time during which said other of the application and the removal of the electric energy is effected in a present operation cycle of the print wire to form a dot at a present one of the printing positions is longer in a first case where a distance between the present printing position and the position at which a next dot is formed in a next operation cycle of the print wire is larger than a predetermined multiple of the printing pitch, than in a second case where the distance indicated above is not larger than the predetermined multiple. In the first case, therefore, the print wire is returned to the non-printing position at a lower speed than in the second case.

Advantages of the dot-matrix printer constructed as described above will be described in detail. If the printing data does not require a dot to be formed by the print wire at the next printing position next to the present printing position, a dot may be formed at a position between the present and next printing positions, due to a large rebounding movement of the print wire after the formation of the dot at the present printing position, if the application or removal of the electric energy to or from the actuator to return the print wire in the present operation cycle is effected in a length of time which is suitable to the case where the printing data requires a dot to be formed also at the next printing position. To avoid this undesirable situation, the discharge control means of the present printer is adapted such that a longer time is provided to apply or remove the electric energy to or from the actuator to slowly retract the print wire, in the case where a dot is not to be formed at the next printing position, than in the case where a dot is to be formed also at the next printing position.

If a dot is not to be formed over a distance equal to a multiple "n" (n=2 or larger integer) of the printing pitch, a dot may be formed at a position between the n-th and (n+1)-th printing positions as counted from the next printing position, due to a large rebounding movement of the print wire if the application or removal of energy to or from the actuator is effected in the length of time suitable to the case where a dot is to be formed also at the next printing position. To avoid this situation, the discharge control means of the present printer is adapted such that a longer time is provided to effect the application or removal of the electric energy to or from the actuator, in the case where a dot is not to be formed ove the above-indicated distance from the present position, than in the case where at least one dot is to be formed over the same distance.

In the dot-matrix impact printer using a print wire, a dot is formed by forcing or pressing the print wire against the recording medium. In one impact printing method, the print wire is impacted directly on the surface of a pressure-sensitive medium which produces a color whose density varies with the pressure applied. In another method, the print wire is forced against the surface of an ordinary or plain recording medium, via a suitable ink material carrier in the form of a ribbon, for example, so that a dot is formed by transfer of the ink material from the carrier to the recording medium.

In the dot-matrix printer constructed as described above, the length of time during which the electric energy is applied to or removed from the actuator to retract the print wire to the non-printing position in the present operation cycle is made longer in the case where a dot is not to be formed over a range between the present printing position and the position which is spaced from the present printing position by a distance equal to the predetermined multiple of the printing pitch, than in the case where a dot is to be formed over the above-indicated range. In other words, the energy application or removal time for retracting the print wire is made longer if there is otherwise a possibility that a rebounding movement of the print wire upon returning of the print wire in one operation cycle causes unintended formation of a dot without a drive command to activate the print wire, than in the case there there is no such possibility. Thus, in the situation in which a dot may be unexpectedly formed due to a rebounding movement of the print wire if the actuator is controlled otherwise, the discharge control means of the present printer controls the actuator control means so as to slowly retract the print wire to the non-printing position, whereby the print wire is prevented from undergoing a rebounding movement upon returning to the non-printing position, or undergoes only a slight rebounding movement which does not result in forming a dot.

According to the present dot-matrix printer, the energy application or removal to or from the actuator is effected for a relatively long time to slowly retract the print wire to the non-printing position, only where a dot is undesirably formed due to a large rebounding movement of the print wire upon returning to the non-printing position if the returning movement is effected for a short time as in the case where no such a large rebounding movement of the print wire occurs. Therefore, the present arrangement assures improved printing efficiency and prevents formation of dots otherwise formed due to the rebounding of the print wire.

In the conventional printer, the time for applying or removing an electric energy to or from the actuator is set to be sufficiently long in order to avoid formation of a dot due to the rebounding movement of the print wire. Therefore, a relatively long time is spent in retracting the print wire in each operation cycle of the wire, irrespective of whether there is a possibility of the formation of a dot by the rebounding wire. It is noted that if a dot is to be formed at the next printing position, the rebounding movement of the print wire at the end of the present operation cycle is merely utilized in the next operation cycle to form the dot at the next printing position. Namely, the dot is formed at the next printing position according to a drive command. In this case, the slow application or removal of the energy to or from the actuator results in unnecessarily increasing the printing time. In this respect, the present printer is free of such wasting of time, and assures comparatively high printing efficiency.

In one form of the dot-matrix printer of the invention, the actuator includes piezoelectric element for charging the piezoelectric element, a discharging circuit having second switching means for allowing the piezoelecric element to be discharged, first switching control means for controlling the first switching means, second switching control means for controlling the second switching means, and voltage limiting means for preventing the piezoelectric element from receiving an excessive electric energy. The first switching control means is adapted to control the first switching means such that the first switching means is normally placed in an original state thereof for inhibiting the piezoelectric element from being charged, and is brought into a charging state thereof for allowing the piezoelectric element to be charged, upon generation of a drive command, the first switching control means returns the first switching means to the original state at a first point of time a predetermined time after a voltage of the piezoelectric element has reached a predetermined level not higher than a line voltage of the power source. The second switching control means is adapted to control the second switching means such that the second switching means is normally placed in an original state thereof for inhibiting the piezoelectric element from being discharged, and brought into a discharging state thereof for allowing the piezoelectric element to be discharged at the above-indicated first point of time or a second switching time a predetermined time after the first point of time. The second switching control means returns the second switching means to the original state by the time when the first switching means is placed in the charging state thereof in the next operation cycle of the print wire. The voltage limiting means is adapted to protect the piezoelectric element from an excessive amount of electric eveners that causes the voltage of the piezoelectric element to exceed the predetermined time after the first point of time. The second switching control means returns the second switching means to the original state by the time when the first switching means is placed in the charging state thereof in the next operation cycle of the print wire. The voltage limiting means is adapted to protect the piezoelectric element from an excessive amount of electric eveners that causes the voltage of the piezoelectric element to exceed the predetermined level indicated above, whereby the voltage of the piezoelectric element is limited to the predetermined level.

In another form of the dot-matrix printer, the actuator comprises a solenoid coil, and the actuator control device comprises a charging circuit having a DC power source, first switching means, the solenoid coil and second switching means which are connected in series to each other in order of description, for charging the solenoid coil, and a discharging circuit having checking means which is connected in series to the solenoid coil and the power source such that the checking means inhibits a flow of an electric current in a direction from a positive terminal of the power source toward a negative terminal of the power source, and allows a flow of an electric current in a direction opposite to the direction in which the flow is inhibited. The discharging circuit allows the solenoid coil to be discharged toward the power source when the first switching means and the second switching means are turned off. In this form of the invention, the discharge control means comprises second switching control means which controls the second switching means such that the second switching means is held off where the distance between the present pritning position and the position in which the next dot is formed is not larger than said predetermined multiple of the predetermined printing pitch, and such that the second switching means is alternately placed on and off where the distance is larger than said predetermined multiple.

BRIEF DESCRIPTION OF THE DRAWINGS

The above and optional objects, features and advantages of the present invention will be better understood by reading the following detailed description of presently preferred embodiments of the invention, when considered in connection with the accompanying drawings, in which.

DETAILED DESCRIPTION OF THE PREFERRED EMBODIMENTS

Figure 1:
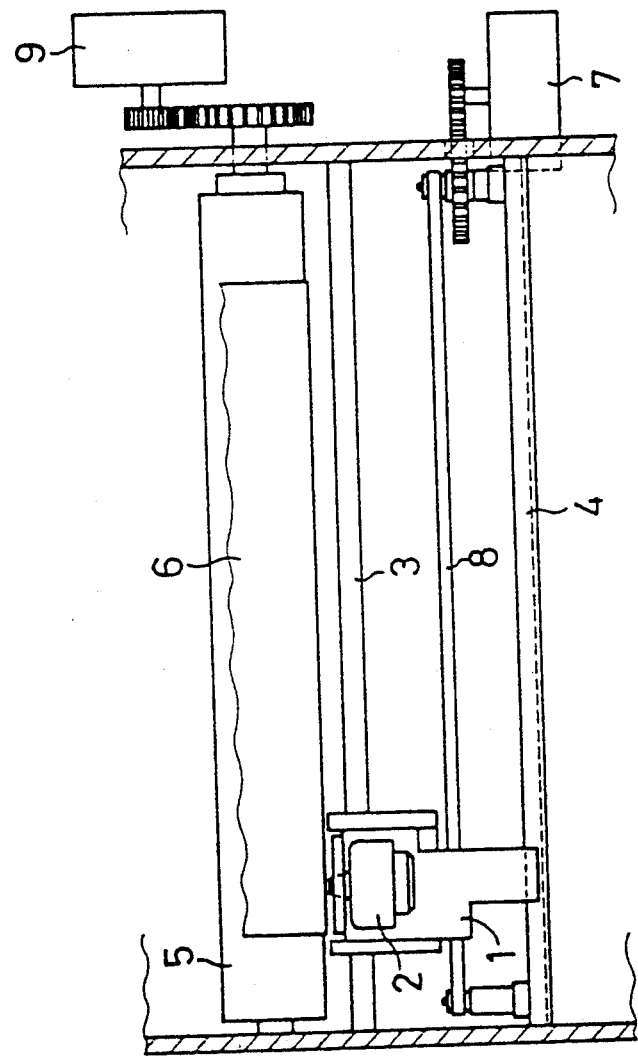
FIG. 1 is a fragmentary schematic plan view of a dot-matrix impact printer with a print head having a piezoelectric actuator which is operated by a driver circuit according to one embodiment of the invention.

Referring first to FIG. 1, the dot-matrix impact printer constructed according to one embodiment of the invention has a carriage 1 on which there is mounted a dot-matrix print head 2. The carriage 1 is slidably supported and guided by a guide rod 3 and a guide rail 4, which extend parallel to a platen 5 for supporting a recording medium 6. The carriage 1 is operatively connected to a carriage drive motor 7 through a belt 8 and other members, so that the print head 2 on the carriage 1 is reciprocated along the platen 5, to effect dot-matrix impact printing on the recording medium 6. The platen 5 is operatively connected to a platen motor 9 so that the platen is rotated to feed the medium 6 in the direction perpendicular to the direction of reciprocating movement of the print head 2.

Figure 2:
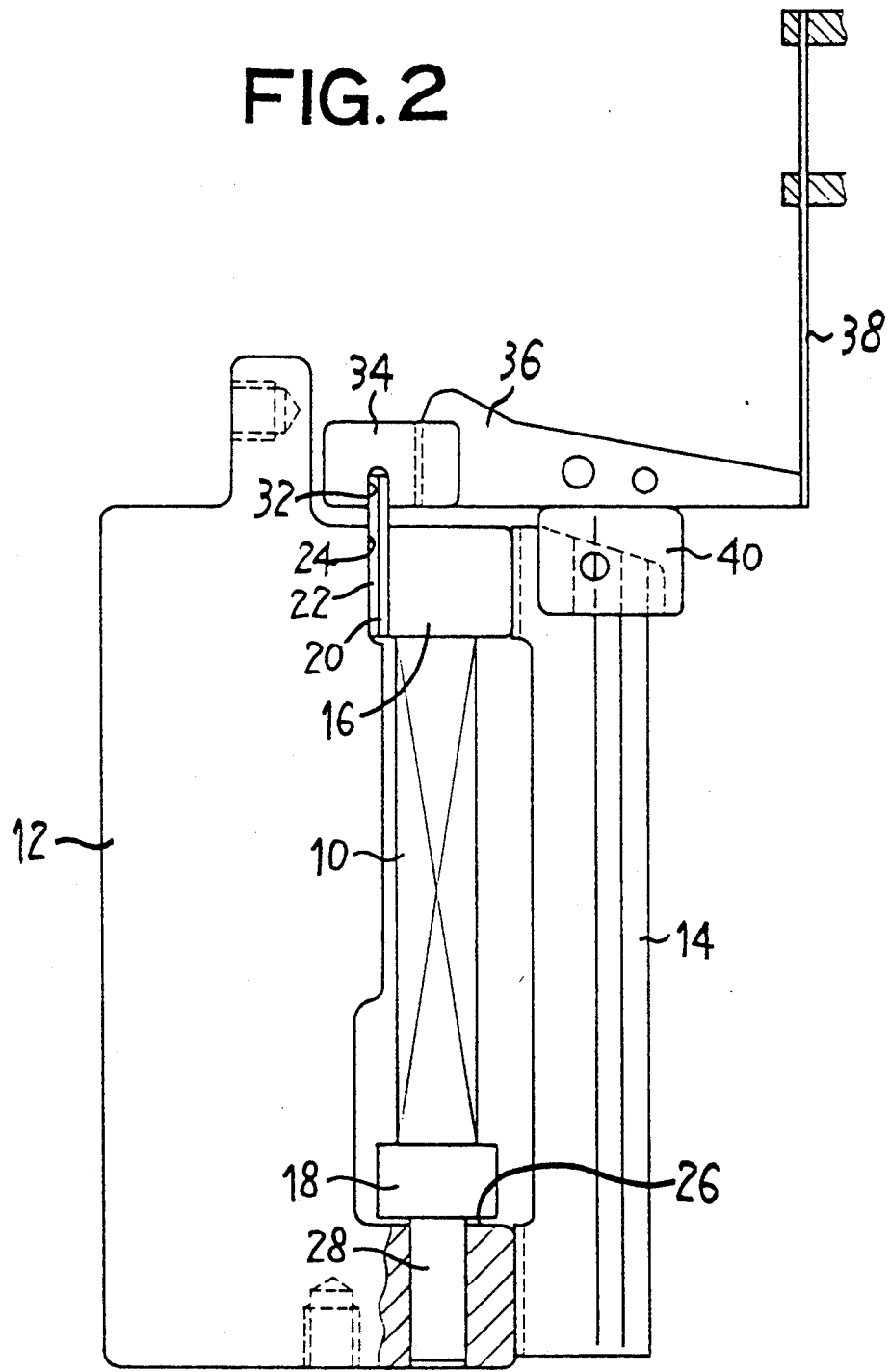
FIG. 2 is a front elevational view of the piezoelectric actuator having a piezoelectric member.
Figure 3:
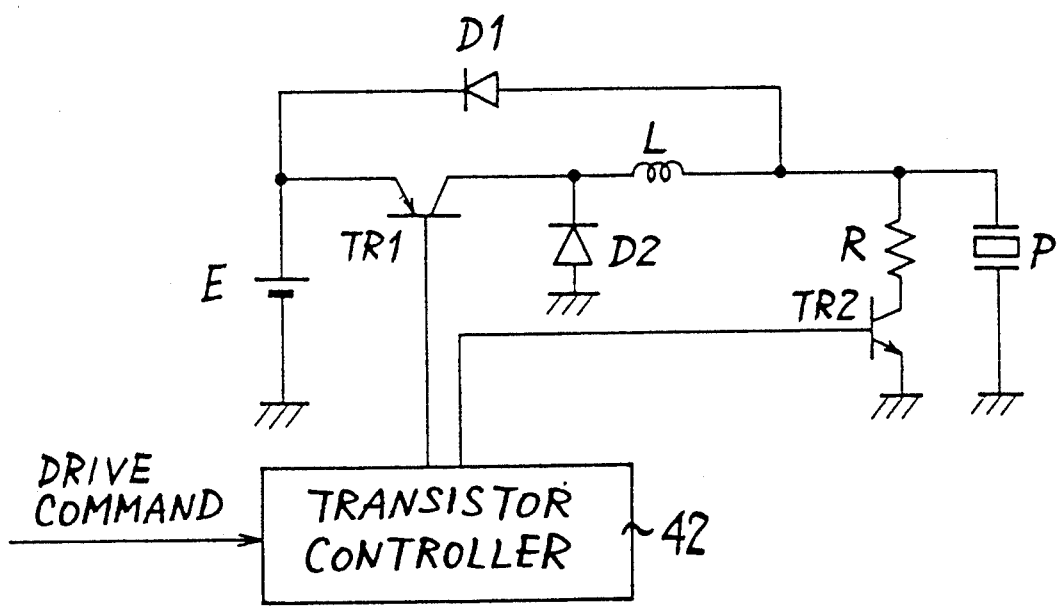
FIG. 3 is a diagram showing the driver circuit for the piezoelectric member.

Referring next to FIG. 2, there is shown one of a plurality of piezoelectric actuators (first through m-th actuators) for activating respective print wires 38 of the print head 2. Each of the piezoelectric actuators incorporates a multiple-layer piezoelectric member 10 which is operatively connected to the corresponding print wire 38. The piezoelectric member 10 has a multiplicity of piezoelectric elements P (only one of which is indicated in FIG. 3, by way of example) which are superposed on each other in a direction (in the vertical direction as seen in FIG. 2), so that the member 10 has a laminar structure. The piezoelectric member 10 is supported by and disposed between two frames 12, 14, which extend in the direction of length of the member 10 and which are spaced from each other in the direction perpendicular to the length of the member 10.

The piezoelectric member 10 has a movable member 6 and a temperature compensating member 18 secured to the opposite longitudinal end faces thereof. Both of these members 16, 18 take the form of a rectangular parallelepiped. A pair of mutually superposed two sheet springs 20, 22 are partly interposed between a surface 24 of the frame 12, and one of the opposite side faces of the movable member 16 which are parallel to the length of the piezoelectric member 10. One face of the temperature compensating member 18 opposite to the face at which the member 18 is secured to the member 10 faces a surface 26 of the frame 12. The sheet spring 20 is secured to the movable member 16 while the sheet spring 22 is secured to the surface 24 of the frame 12. However, the two sheet springs 20 and 22 are merely held in sliding contact with each other. The frame 12 has a pin 28 secured in a hole formed in the surface 26, such that the pin 28 contacts the face of the temperature compensating member 18 which faces the surface 26. Thus, the piezoelectric member 10 is supported by the frames 12, 14 such that a small residual compressive force acts on the member 10 in the longitudinal direction. When the piezoelectric member 10 is elongated in the longitudinal direction upon application of a voltage thereto, the sheet spring 20 is moved relative to the other sheet spring 22 in a forward direction (in the upward direction as seen in FIG. 2). When the member 10 is contracted upon removal of the voltage therefrom, the sheet spring 20 is displaced relative to the sheet spring 22 in the opposite direction.

The piezoelectric member 10 has a residual strain in the forward direction even after the voltage is completely released therefrom. The amount of this residual strain decreases with an increase in the temperature. Consequently, the operating end (adjacent to the movable member 16) of the piezoelectric member 10 does not reach the nominal operated position after the member 10 is displaced all the way upon energization thereof by the applied voltage, when the temperature is relatively high, even if the voltage applied to the member 10 is constant to assure a constant amount of displacement of the member 10. That is, the distance between the actual operated position of the piezoelectric member 10 and the nominal operated position increases as the temperature of the member 10 increases. To avoid or compensate for a fluctuation in the operated position of the piezoelectric member 10 due to a variation in the operating temperature, the temperature compensating member 18 is provided between the member 10 and the support pin 28, such that the member 18 is connected in series with the member 10 in the longitudinal direction of the member 10. The member 18 expands as the temperature changes, such that the amount of elongation in the longitudinal direction of the member 10 increases with an increase in the temperature. Thus, the shortage in the distance of displacement of the operating end of the piezoelectric member 10 to the nominal operated position can be compensated for by the elongation of the temperature compensating member 18, so that the position of the operating end of the member 10 does not vary with a change in the operating temperature.

The frame 14 consists of an elastically deformable or yieldable elongate sheet member longer than the piezoelectric member 10. The frame 14 connects the movable member 16 and a portion of the frame 12 adjacent to the support pin 28 and temperature compensating member 18. The function of this frame 14 will be explained later.

The movable member 16 is connected to a holder member 34 via the sheet springs 20, 22. The holder member 34 has a linearly formed groove 32 in which are fixedly fitted the end portions (upper end portions as seen in FIG. 2) of the sheet springs 20, 22 remote from the end portions on the side of the piezoelectric member 10. The groove 32 has a width slightly larger than the sum of the thicknesses of the two sheet springs 20, 22, and the opposite outer surfaces of the sheet springs 20, 22 are secured to the opposite surfaces of the groove 32. An arm 36 extends from the holder member 34, and the print wire 38 is fixed at one end thereof to the free end of the arm 36. The print wire 38 extends toward the platen 5 such that the face of the free or operating end of the wire faces the recording medium 6 via a suitable print ribbon.

When the piezoelectric member 10 is elongated causing the sheet spring 20 to slidably move on the sheet spring 22 in the upward direction, the holder member 34 is pivoted substantially about the widthwise centerline of the groove 32, in the counterclockwise direction as seen in FIG. 2, whereby the print wire 38 is advanced toward the recording medium 6, to the fully advanced position. As a result, the operating end of the print wire 38 is forced against the recording medium 6 through the print ribbon. Thus, an ink material of the ribbon is transferred to a selected area of the medium 6, by the impacting action of the print wire 38, whereby a dot is formed in the selected area. When the piezoelectric member 10 is contracted after the impacting action of the print wire 38, the holder member 34 is pivoted in the clockwise direction, whereby the print wire 38 is returned to its fully retracted position. This fully retracted position is determined by abutting contact of the arm 36 with a stop 40 fixed to the frame 14. The stop 40 is made of a rubber material having a relatively low degree of resiliency.

When the print wire 38 is impacted against the recording medium 6 through the print ribbon as a result of elongation of the piezoelectric member 10, a counterclockwise moment Mccw (as seen in FIG. 2) acts on the movable member 16, substantially about the center of the movable member, whereby the piezoelectric member 10 is subjected to a resulting bending moment, that may cause the member 10 to be bent in the direction intersecting the length of the member 10. In the present piezoelectric actuator, however, the member 10 is protected from such a bending moment, by the elastically deformable frame 14. More specifically, the elongation of the piezoelectric member 10 causes the frame 14 to be elastically elongated, causing a clockwise moment Mcw which acts on the movable member 16 in the clockwise direction. Consequently, the two moments Mccw and Mcw acting in the opposite directions are offset or counterbalanced by each other, permitting the piezoelectric member 10 to be linearly elongated and contracted without an excessive amount of bending moment acting thereon.

It will be understood from the above description that the present piezoelectric actuator shown in FIG. 2 is adapted to transmit the displacement of the piezoelectric member 10 to the print wire 38, such that the amount of the displacement is amplified or boosted by the pair of sheet springs 20, 22, holder member 34 and arm 36, into the linear impacting movement of the print wire 38.

Figure 16:
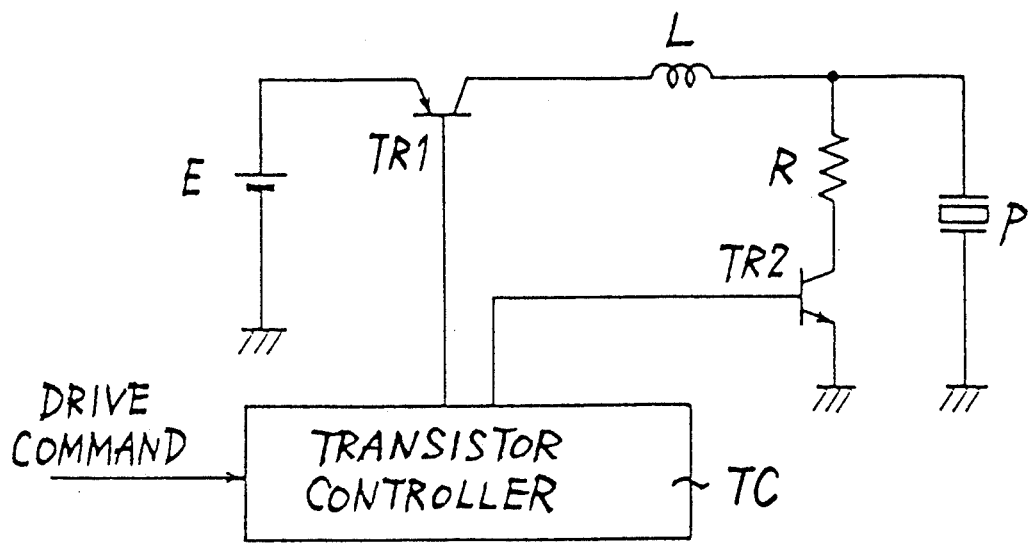
FIG. 16 is a diagram showing a driver circuit for a piezoelectric element, which was developed by the assignee of the present application.
Figure 17:
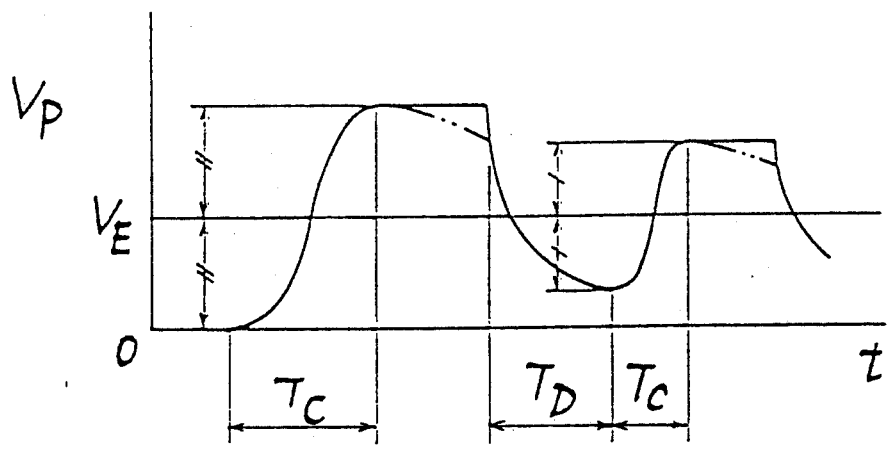
FIG. 17 is a graph illustrating a change in the voltage of the piezoelectric element when driven by the driver circuit of FIG. 15.

Reference is now made to the diagram of FIG. 3, which shows a driver circuit for controlling the piezoelectric member 10. This driver circuit is an improvement of the driver circuit shown in FIG. 16, by adding a first diode D1 which by-passes the serial connection of the first transistor TR1 and the coil L, and a second diode D2 connected to a line connecting the first transistor TR1 and the coil L. The second diode D2 is grounded. The first diode D1 allows a flow of an electric current in a direction from the coil L toward the DC power source E, and the second diode D2 allows an electric current to flow in a direction from the ground toward the coil L. In the interest of simplification, only one piezoelectric element P of the piezoelectric member 10 is illustrated in the diagram of FIG. 3. The mutually superposed multiple piezoelectric elements P are electrically connected in parallel to each other. It is noted, however, that the principle of the present invention may be practiced when the driver circuit is adapted to drive a single piezoelectric element P.

Figure 4:
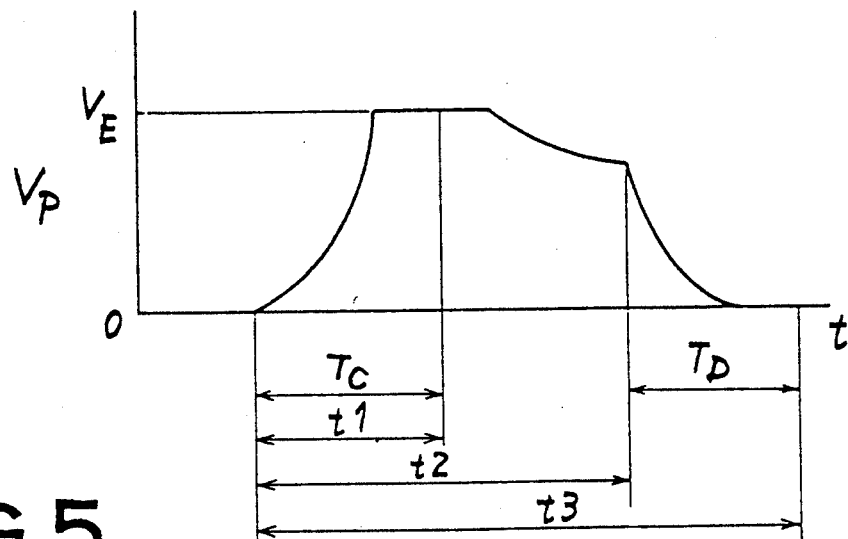
FIG. 4 is a graph illustrating a change in the voltage of the piezoelectric member.

The first and second transistors TR1 and TR2 are turned on and off, or selectively placed in respective charging and discharging states, under the control of a transistor controller 42. When a drive command to activate the print wire 38 is received by the transistor controller 42, the normally open first transistor TR1 is turned on or closed, permitting an electric energy of the DC power source E to be applied to the piezoelectric element P through the first transistor TR1 and coil L, whereby the element P is charged while the element P and the coil L oscillate together. With the first transistor TR1 turned on or placed in its charging state, a voltage $V_P$ across the piezoelectric element P starts to rise from the zero level, and eventually reaches a level equal to a line voltage $V_E$ of the DC power source E, as indicated in the graph of FIG. 4. Since the voltage at a point between the first diode D1 and the piezoelectric element P will subsequently become higher than that at a point between the first diode D1 and the power source E, the electric current flowing from the coil L toward the piezoelectric element P will flow through the first diode D1 and the first transistor TR1 and return to the coil L, whereby an electric energy is stored in the coil L, without the piezoelectric element P being charged any longer. Therefore, the voltage $V_P$ of the piezoelectric element P will not exceed the line voltage $V_E$. While the energy of the piezoelectric element P is consumed due to abutting contact of the print wire 38 against the recording medium 6 or for other factors, the consumed amount of energy is compensated for by a supplemental supply of electric energy from the power source E through the first transistor TR1 and coil L, whereby the voltage $V_p$ of the element P is held constant.

The transistor controller 42 turns off the first transistor TR1 or returns the transistor TR1 to its original state, at a predetermined point of time which is a certain time after the moment when the voltage $V_P$ should have reached the line voltage $V_E$. Namely, the first transistor TR1 is turned off when a first predetermined time t1 has passed after the transistor TR1 is turned on, i.e., after the drive command is received by the transistor controller 42, as indicated in FIG. 4. This time t1 is a charging time $T_C$ during which the first transistor TR1 is held on or in the charging state. With the transistor TR1 turned off, the electric energy stored in the coil L is returned to the DC power source E, through a closed path which includes the coil L, first diode D1, power source E and second diode D2. While the first transistor TR1 is held off, the voltage $V_P$ of the piezoelectric element P is lowered as a result of consumption of the energy of the element P, since the energy is not supplied from the power source E to the element P to compensate for the energy consumption by the element P, even if the voltage $V_P$ falls below the line voltage $V_E$. The graph of FIG. 4 indicates a period during which the voltage $V_P$ is held substantially equal to the line voltage $V_E$ after the first transistor TR1 is turned off. This period exists because the energy consumption by the piezoelectric element P is compensated for by the transfer of an energy from the coil L into the element P due to a flow of a current through a closed path which includes the element P and the second diode D2.

The transistor controller 42 turns on the second transistor TR2 at a predetermined point of time which is either the moment at which the electric energy should have been completely released from the coil L, or a moment a certain time after that moment. Namely, the econd transistor TR2 is turned on when a second predetermined time t2 has passed after the drive command is received by the transistor controller 42, as indicated in FIG. 4. As a result, the peizoelectric element P is discharged, with the energy released from the element P being consumed by a resistor R. Thus, the voltage $V_P$ of the element P is lowered. The transistor controller 42 turns off the second transistor TR2 at a predetermined point of time which is either the moment at which the voltage $V_P$ should have been completely zeroed, or a moment a certain time after that moment. That is, the second transistor TR2 is turned off when a predetermined third time t3 has passed after the drive command is received by the transistor controller 42, as indicated in FIG. 4. It will be understood that a difference between the third and second times t3 and t2 is a discharging time $T_D$.

As is apparent from the above explanation, the present embodiment is capable of holding the voltage $V_P$ of the piezoelectric element P at a constant level (equal to the line voltage $V_E$), at least for a period between the moment when the voltage $V_P$ has reached the line voltage $V_E$ and the moment at which the charging time Tc expires. It is also noted that the voltage $V_P$ during this period do not fluctuate in different printing cycles, i.e., in different activation cycles of the print wire 38 or different operation cycle of the driver circuit of FIG. 3. Accordingly, the operated position of the piezoelectric element P and the fully advanced position of the print wire 38 are held constant in the different activation cycles of the print wire 38 for forming dots at different printing positions on the recording medium 6. Further, in each activation cycle of the print wire 38, the piezoelectric element P can be maintained for a sufficiently long period, in its operated position corresponding to the fully advanced position of the print wire 38.

In the present embodiment, the charging of the piezoelectric element P for the next activation cycle of the print wire 38 is started only after the electric energy remaining in the element P in the present activation cycle is completely released. Therefore, the amount of displacement (distance between the initial or non-operated position and the operated position) of the piezoelectric element P in each activation cycle of the print wire 38 is made constant, whereby the drive force of the element P and the printing pressure of the print wire 38 are made constant, assuring improved quality of the printed dots.

It will be understood that the first transistor TR1 and a portion of the transistor controller 42 assigned to control the first transistor TR1 cooperate to constitute first conditioning means for charging the piezoelectric element P, while the resistor R, the second transistor TR2 and a portion of the controller 42 assigned to control the second transistor TR2 cooperate to constitute second conditioning means for discharging the element P, and further understood that the first and second diodes D1, D2 cooperate to constitute voltage limiting means for limiting the voltage VP of the element P to the line voltage $V_E$.

Figure 5:
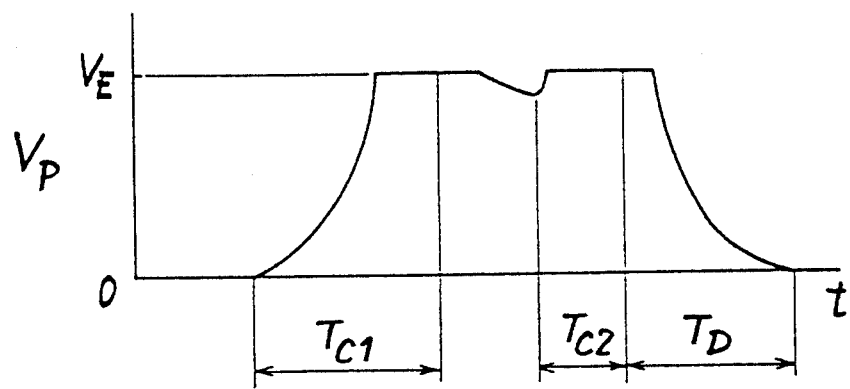
FIG. 5 and 6 are graphs illustrating changes in the voltage of the piezoelectric member, similar to that of FIG. 4, when the driver circuit is controlled differently.

The transistor controller 42 may be modified so that the voltage of the piezoelectric element P is controlled as illustrated in the graph of FIG. 5. That is, after the first transistor TR1 is turned off after a first charging time $T_{C1}$, the same transistor TR1 is again turned on at a moment a suitable short time before the second transistor TR2 is turned on. In this case, the transistor TR1 is held on for a second charging time $T_{C2}$, and then turned off at the same time when the second transistor TR2 is turned on to start the discharging time $T_D$. According to this embodiment, each time a drive command is received, the transistor controller 42 holds the first transistor TR1 in the charging state, two times, for the first charging time $T_{C1}$ and the second charging time $T_{C2}$. Accordingly, the voltage $V_P$ of the piezoelectric element P is held substantially at the line voltage $V_E$ not only for a period between the moment when the voltage $V_P$ reaches the line voltage $V_E$ during the first charging time $T_{C1}$ and the moment when the first charging time $T_{C1}$ expires, but also for a period between the moment when the line voltage $V_E$ is again reached during the second charging time $T_{C2}$ and the moment when the second charging time $T_{C2}$ expires. Thus, the printing pressure of the print wire 38 is held constant for these two periods. In the present embodiment, the constant printing pressure is maintained for a longer period of time than in the preceding embodiment. The transistor controller 42 may be arranged such that the first transistor TR1 is normally turned on once to provide the first charging time $T_{C1}$ only, and is turned on twice to provide the first and second charging times $T_{C1}$ and $T_{C2}$ when the dot is formed with a higher degree of density with a higher printing pressure of the print wire 38. In the embodiment of FIG. 5, the discharging of the piezoelectric element P is started when the second charging of the element P is terminated. Consequently, an electric energy is left in the coil L upon starting of the discharging, and both of the energy left in the piezoelectric element P and the energy which is not returned to the power source E and remains in the coil L are consumed by the resistor R when the second transistor TR2 is turned on. Therefore, it takes a longer time for the energy to be completely released from the element P, in the present embodiment of FIG. 5, than in the embodiment of FIG. 4. However, since the amount of charging during the second charging time $T_{C2}$ is not so large, the additional time for releasing the energy from the element P is not considerable.

Figure 6:
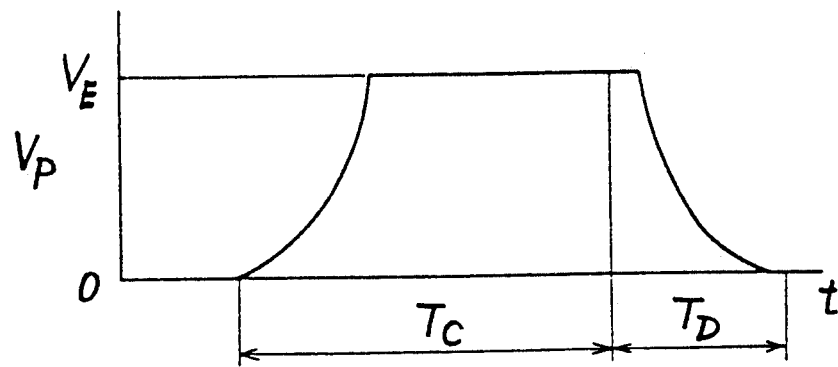

The transistor controller 42 may be further modified so as to control the voltage of the piezoelectric element P as indicated in FIG. 6. In this embodiment, the first transistor TR1 is held on by the time when the second transistor TR2 is turned on, so that the charging time $T_C$ is immediately followed by the discharging time $T_D$. According to this arrangement, an energy is supplied to the piezoelectric element P, to compensate for the amount of the energy which is consumed by the piezoelectric element P during the period between the moment when the voltage $V_P$ reaches the line voltage $V_E$ and the moment when the charging time $T_C$ expires. Therefore, the voltage $V_P$ is held substantially at the line voltage $V_E$ during the above-indicated period, i.e., until the discharging time $T_D$ begins. In this embodiment, the energy is left in the coil L when the discharging begins, and the discharging time $T_D$ is slightly longer than that in the embodiment of FIG. 4, since the energies left in the piezoelectric element P and the coil L should be consumed by the resistor R.

Figure 7:
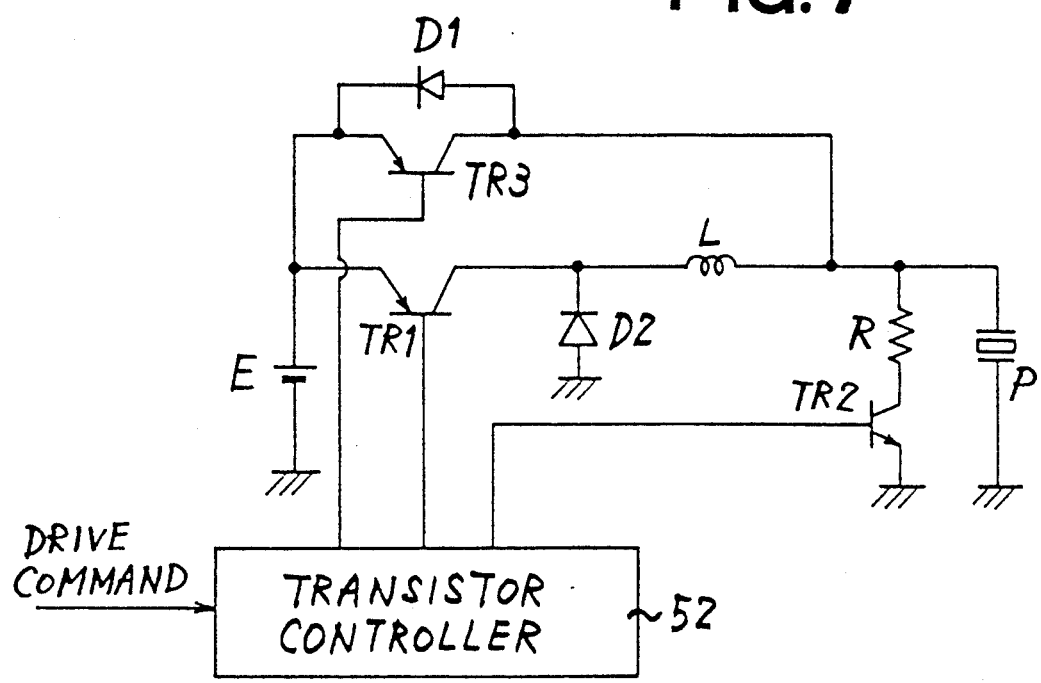
FIG. 7 is a diagram showing a driver circuit used in another embodiment of the invention.

Referring next to FIG. 7, there is shown another form of the driver circuit of the present invention, which is a modification of the embodiment of FIG. 3. That is, a third transistor TR3 is provided in parallel connection to the first diode D1. The third transistor TR3 allows an electric current to flow in the direction from the power source E toward the piezoelectric element P. That is, the direction of flow of the current through the third transistor TR3 is opposite to the direction of flow of the current through the first diode D1.

Figure 8:
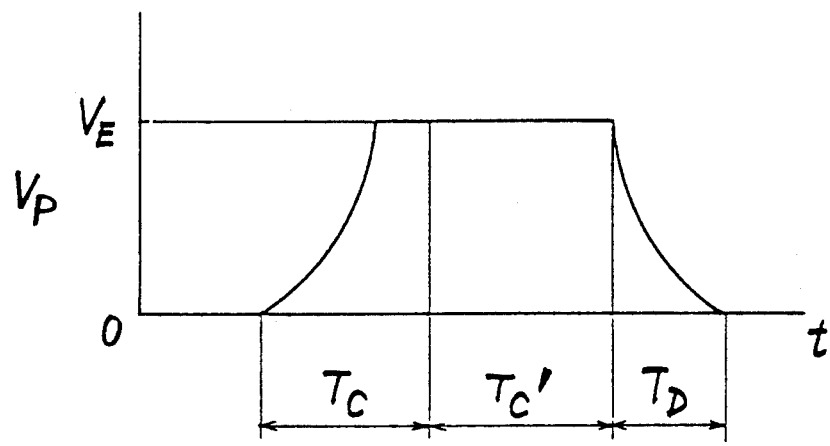
FIG. 8 is a graph corresponding to that of FIGS. 4–6, illustrating the voltage change of the piezoelectric member when operated by the driver ciruit of FIG. 7.

The first, second and third transistors TR1, TR2 and TR3 are controlled by a transistor controller 52. In response to a drive command to activate the print wire 38, the controller 52 turns on the first transistor TR1, whereby the piezoelectric element P is charged, with the voltage $V_P$ rising as indicated in the graph of FIG. 8. When the voltage $V_P$ of the element P has become equal to the line voltage $V_E$, the current starts to flow through the first diode D1, and the voltage $V_P$ is held at the line voltage $V_E$. After the voltage V reaches the line voltage $V_E$, the first transistor TR1 is turned off while at the same time the third transistor TR3 is turned on. Therefore, if the energy of the element P is consumed, an energy is supplied from the power source E to the element P through the third transistor TR3, rather than through the coil L as in the arrangement of FIG. 3. On the other hand, the energy stored in the coil L is returned to the power source E through a closed path which includes the coil L, first diode D1, power source E and second diode D2. As a result, no energy is left in the coil L when the transistor controller 52 turns off the third transistor TR3 and simultaneously turns on the second transistor TR2. Accordingly, the discharging of the piezoelectric element P is completed within a comparatively short time. The period during which the third transistor TR3 is held on is indicated at $T_C'$ in FIG. 8. In the present embodiment, the voltage $V_P$ of the element P is held at the line voltage $V_E$ for a period between the moment when the voltage $V_P$ reaches the voltage $V_E$ and the moment when the discharging time $T_D$ begins immediately following the second charging time $T_C$.

In the present embodiment, the first and third transistors TR1, TR3 and a portion of the transistor controller 52 assigned to control the transistors TR1, TR3 constitute the first conditioning means, while the resistor R, the second transistor TR2 and a portion of the controller 52 constitute the second conditioning means. Further, the first and second diodes D1, D2 constitute the voltage limiting means.

Figure 9:
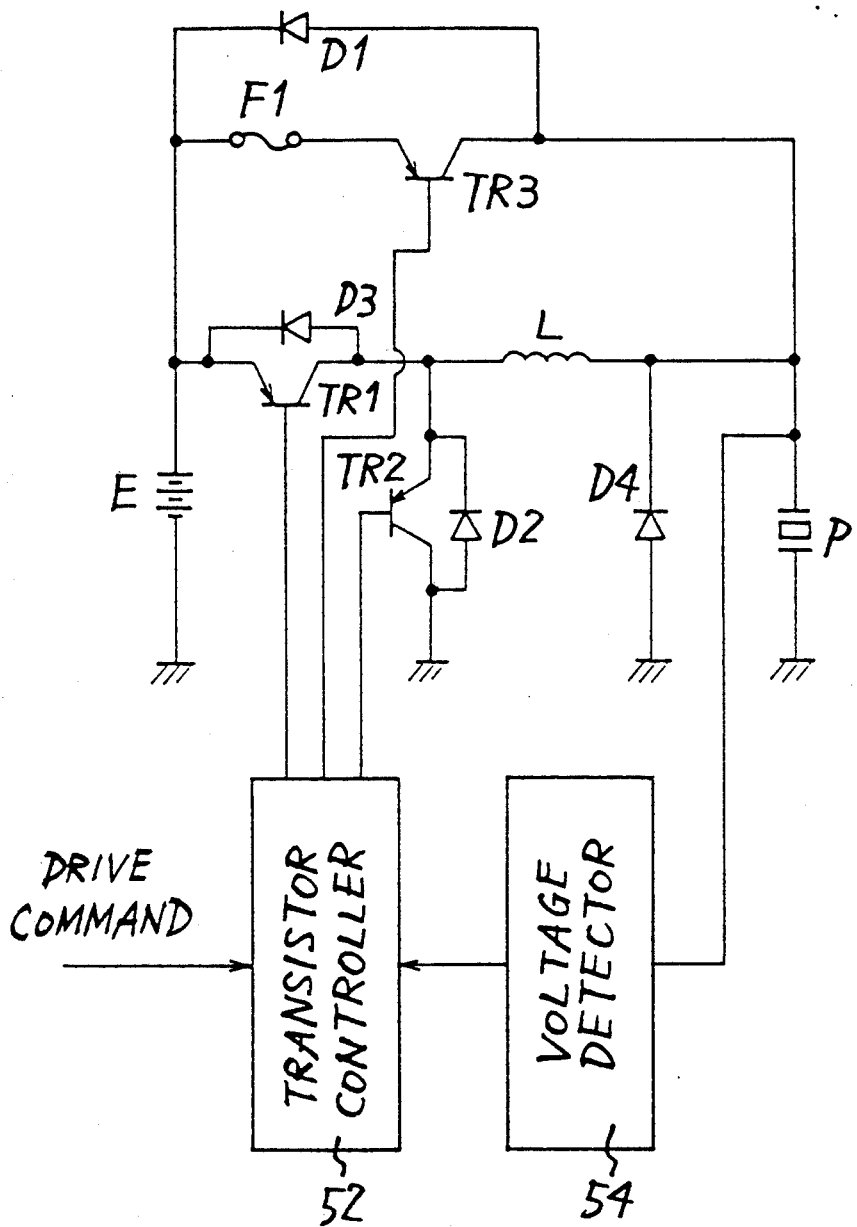
FIG. 9 is a diagram showing a driver circuit used in a further embodiment of the invention.

The embodiment of FIG. 7 may be modified as illustrated in FIG. 9. This modified driver circuit has a protector F1 connected between the third transistor TR3 and the DC power source E, in parallel connection with the first diode D1. This protector F1 is provided to protect the third transistor TR3 against an excessive amount of an electric current which may flow therethrough if the first transistor TR1 fails to be turned on. Since the required capacity of the third transistor TR3 is considerably smaller than that of the first transistor TR1, a considerably large amount of current will flow through the third transistor TR3 when it is turned on, in the event of a failure of the first transistor TR1 for some reason or other. To protect the third transistor TR3 in this event, the protector F1 is provided in series connection with the third transistor TR3, so that the protector is brought to its disconnected state to inhibit a current from flowing therethrough when the current exceeding the rated capacity of the transistor TR3 is applied to the protector, thereby protecting the transistor TR3.

Although the protector F1 is disposed between the power source E and the third transistor TR3 in the above embodiment, the protector F1 may be disposed at any position in a closed path which includes the power source E, third transistor TR3 and piezoelectric element P.

The piezoelectric element P is connected to a voltage detector 54 adapted to detect the voltage $V_P$ of the element P. A signal from the voltage detector 54 is applied to the transistor controller 52. Based on this signal, the controller 52 turns off the first and second transistors TR1 and TR2. In other words, the voltage detector 54 is provided to determine the moment at which the first transistor TR1 is turned off when the voltage $V_P$ reaches the line voltage $V_E$, and the moment at which the second transistor TR2 is turned off when the voltage $V_P$ is zeroed.

In the embodiments of FIGS. 4–8, the transistor controller 42, 52 is adapted to control the transistors TR1, TR2, TR3 in response to a received drive command for activating the print wire 38, such that the controller 42, 52 itself determines the moments which define the charging time $T_C$, first and second charging times $T_{C1}$, $T_{C2}$, or $T_C$ and $T_{C'}$, and discharging time $T_D$. In the embodiment of FIG. 9, the first charging time $T_C$ and the discharging time $T_D$ are determined based on the voltage $V_P$ detected by the voltage detector 54. However, the controller 42, 52 may be modified to receive transistor control data together with the drive command, so that the controller controls the transistors TR1, TR2, TR3 according to the transistor control data which represents the moments at which the transistors are turned on and off as described above.

While the first and third transistors TR1, TR3 used in the above embodiments have two states, i.e., "off" or original state for inhibiting the charging of the piezoelectric element, and "on" or charging state for allowing the charging of the element P, it is possible to replace these transistors TR1, TR3 by suitable analog switches or other switching means which have three states, i.e., an "off" state as indicated above, and two "on" states in which the switching means allows an electric current to flow in the opposite directions, respectively.

Figure 10:
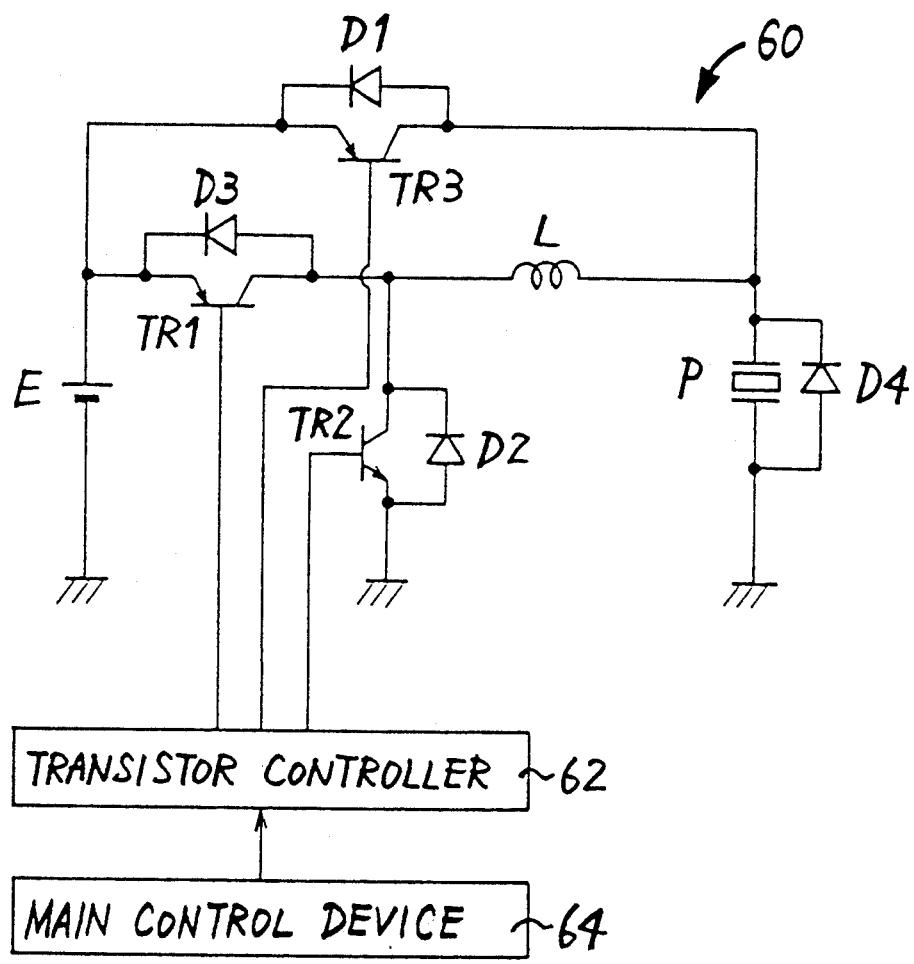
FIG. 10 is a diagram showing a still further embodiment of the invention.

By reference to FIG. 10, there is shown a further embodiment of the present invention. The driver circuit according to this embodiment, which is indicated at 60 in FIG. 10, is basically similar to the driver circuit of FIG. 7, in that the three transistors TR1, TR2 and TR3 and the two diodes D1, D2 are provided to attain the same functions as described above. However, the present embodiment is different from the embodiment of FIG. 7, because of the provision of a third and a fourth diode D3, D4, elimination of the resistor R and relocation of the second transistor TR2 and second diode D2, and in the manner in which the piezoelectric element P is discharged during the discharging time $T_D$.

In the driver circuit 60, the third diode D3 is connected in parallel to the first transistor TR1, so as to by-pass the transistor TR1, such that the third diode D3 allows a flow of a current in the direction from the coil L toward the positive terminal of the power source E. The second transistor TR2 is connected to a part of the circuit between the coil L and the first transistor TR1, and is grounded. The second diode D2 is connected in parallel to the second transistor TR2, so as to by-pass the transistor TR2. The piezoelectric element P is also by-passed by the fourth diode D4 connected in parallel thereto, so that the fourth diode D4 allows an electric current to flow from the negative terminal toward the positive terminal of the element P.

The first, second and third transistors TR1, TR2, TR3 are controlled by a transistor controller 62. This controller 62 is provided for each of the driver circuits 60 (first through m-th circuits) corresponding to the respective print wires 38. The controllers 62 for the respective driver circuits 60 are connected to a common main control device 64.

The main control device 64 receives printing data from an external host computer. The printing data includes wire activation data for activating the appropriate ones of the print wires 38 to form dots at each one of the predetermined printing positions which are spaced from each other at a predetermined printing pitch along the direction of movement of the print head 2 relative to the platen 5. Based on the wire activation data, the main control device 64 applies drive commands to the transistor controllers 62 corresponding to the print wires 38 which should be activated to effect printing at each printing position. The main control device 64 determines whether the drive command for the present activation cycle of the relevant print wire 38 is given to form a dot at the last printing position of the presently printed line, or not. If the dot in question is to be formed at the last printing position of the line, the main control device 64 applies an extended-discharge command to the relevant transistor controller 62 which has received the drive command to form the dot at the last printing position of the line. The extended-discharge command will cause the piezoelectric element P to be discharged for a relatively long time, as described below. If the position at which the relevant dot is to be formed is not the last printing position of the line, the main control device 64 then determines whether a dot is to be formed at the next printing position of the line or not, i.e., whether the next drive command for the same print wire 38 is for forming a dot at the position next to the present printing position at which the dot is to be formed according to the present drive command. If a dot is not to be formed at the next printing position, the main control device 64 applies the extended-discharge command to the relevant transistor controller 62. If a dot is to be formed at the next printing position, no extended-discharge command is applied to the transistor controller 62.

When the transistor controller 62 receives the drive command to activate the appropriate print wire 38, the driver circuit 60 is controlled in the following manner.

The three transistors TR1, TR2, TR3 are all normally placed in the off position. In response to the drive command received from the main control device 64, the transistor controller 62 turns on the first transistor TR1. As a result, the voltage VP of the piezoelectric element P is raised, and the print wire 38 is moved from the fully retracted position toward the fully advanced position for printing on the medium 6.

The operating end of the print wire 38 comes into pressing or abutting contact with the medium 6 slightly before the voltage $V_P$ reaches the line voltage $V_E$. After the voltage $V_P$ has reached the voltage $V_E$, the electric current flowing from the coil L is returned to the same through the first diode D1 and the first transistor TR1, and the energy is no longer stored in the piezoelectric element P, whereby the voltage $V_P$ does not exceed the voltage $V_E$, as described above with respect to the preceding embodiments. If the energy of the element P is consumed due to the abutting contact of the print wire 38 with the medium 6, an energy is supplied from the power source E to the element P through the first transistor TR1 and the coil L, in order to hold the voltage $V_P$ substantially at the line voltage level $V_E$.

Then, the transistor controller 62 turns off the first transistor TR1 and turns on the third transistor TR3, at a point of time a suitable time after the voltage $V_P$ has reached the line voltage $V_E$. As a result, there is formed a closed path which includes the coil L, first diode D1, power source E and second diode D2, whereby the energy is released from the coil L and returned to the power source E, until the energy in the coil L is zeroed.

The second transistor TR2 is turned on to start discharging the piezoelectric element P when a predetermined time has passed after the drive command has been received by the controller 62, namely, at the time when the energy has been completely released from the coil L, or a point of time a suitable time after that time. The manner of discharging the piezoelectric element P will be described.

Figure 11:
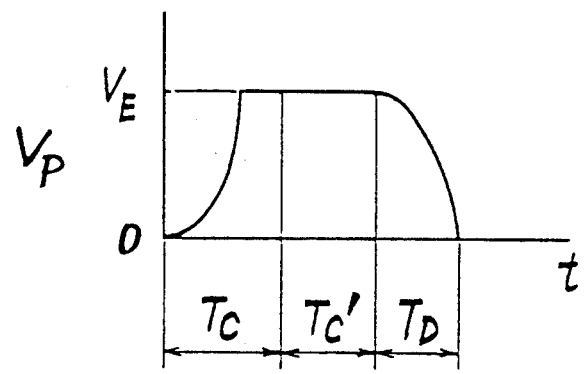
FIGS. 11 and 12 are graphs illustrating changes in the voltage of the piezoelectric member of the embodiment of FIG. 10, when the driver circuit is controlled differently.

In the case where the extended-discharge command is not applied to the transistor controller 62, the piezoelectric element P is discharged by first turning on the second transistor TR2. As a result, there is formed a closed path which includes the element P, coil L and second transistor TR2, whereby the energy stored in the element P is transferred to the coil L, and the element P is thus discharged. The discharging time $T_D$ as indicated in FIG. 11 is determined by the equivalent capacitance of the element P and the reactance of the coil L. That is, the time $T_D$ expires when the voltage $V_P$ is lowered to the zero level. As the piezoelectric element P is discharged, the print wire 38 is retracted away from the recording medium 6, and is eventually returned to the fully retracted position. Since the arm 36 is brought into abutting contact with the stop 0, the print wire 38 rebounds from the stop 40 to some extent. Since a dot is to be formed at the next printing position, following the dot which has been formed at the present printing position, the rebounding of the print wire 8 may be effectively utilized for the next printing movement toward the medium 6. In other words, the rebounding print wire 38 will not cause a problem of unexpectedly forming a dot without the corresponding drive command.

The transistor controller 62 monitors the voltage $V_P$ of the piezoelectric element P based on a signal from a suitable voltage detector as indicated at 54 in FIG. 9, and turns off the second transistor TR2 when the voltage $V_P$ been lowered to zero, i.e., when the entire energy stored in the element P has been released. As a result, there is formed a closed path which includes the coil L, third diode D3, DC power source E and fourth diode D4. Consequently, the energy stored in the coil L is returned back to the power source E. It is noted that the fourth diode D4 is provided to prevent the energy in the coil L to be transferred to the element P.

In the case where the extended-discharge command is applied to the transistor controller 62, the controller 62 controls the second transistor TR2 such that the transistor TR2 is alternately turned on and off at a predetermined frequency, i.e., so as to maintain a predetermined duty cycle. While the second transistor TR2 is on, a portion of the energy in the element P is transferred to the coil L, and the voltage $V_P$ of the element P is lowered at a rate which is determined by the equivalent capacitance of the element P and the reactance of the coil L.

While the second transistor is off while an energy is stored in the piezoelectric element P and the fourth diode D4 is off in the presence of a potential difference across the diode D4, there is formed a closed path which includes the element P, coil L, third diode D3 and power source E. Consequently, the voltage $V_P$ is lowered at a rate which is determined by the equivalent capacitance of the element P, the reactance of the coil L and the line voltage $V_E$ of the power source E. That is, the voltage $V_P$ is lowered at a rate lower than that described in the preceding paragraph.

Figure 12:
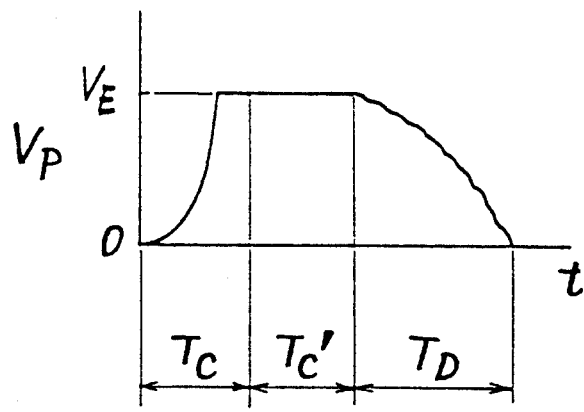

Therefore, the alternately turning on and off the second transistor TR2 causes two alternately appearing short periods in which the rate of lowering the voltage $V_P$ is comparatively high and low, respectively, as indicated in the graph of FIG. 12. As a result, the discharging of the piezoelectric element P continues for a longer time when the extended-discharge command is generated, than when the extended-discharge command is not generated. In other words, the discharging time $T_D$ as indicated in FIG. 12 is longer than that as indicated in FIG. 11. Accordingly, the arm 36 and the print wire 38 are returned to the fully retracted position at a comparatively low speed in a comparatively long time, whereby the amount of rebound of the arm 36 from the stop 40 is limited to a reduced value, and the print wire 38 will not rebound to form a dot at the next or subsequent printing position at which no dot is expected to be formed. After the voltage $V_P$ of the element P has been zeroed by the alternate on-off operations of the second transistor TR2, the transistor controller 62 holds the transistor TR2 in the off state.

In the present embodiment, the discharging time $T_D$ and the dot forming time are determined so that the discharging of the piezoelectric element P according to the extended-discharge command in the present activation cycle of the print wire 38 can be completed before another activation cycle can be started to effect an operation to form a dot at the second printing position as counted from the next printing position, that is, to form a dot at the printing position which is spaced from the present printing position by a distance which is two times the predetermined printing pitch. In other words, the print wire 38 is moved past the next printing position while the piezoelectric element P is discharged at the extended period $T_D$, and the discharging is completed so that a dot can be formed by the print wire 38 at the second printing position as counted from the above-indicated next printing position. It is possible that the piezoelectric element P for one print wire 38 is slowly discharged according to the extended-discharge command while the piezoelectric element P for another print wire 38 which is scheduled to form a dot at the position corresponding to the above-indicated next printing position is rapidly discharged so that the dot can be formed at the intended position by said another print wire 38. It is noted that the slow discharging of the piezoelectric elements P to avoid undesirable formation of dots according to the present arrangement does not require the print head 2 to be fed at a reduced speed along the platen 5, thereby permitting a high-speed printing operation without the conventionally experienced drawback.

It will be understood from the above description of the embodiment of FIG. 10 that the main control device 64 which applies the extended-discharge command to the transistor controller 62 according to the received printing data, so as to control the second transistor TR2 according to the extended-discharge command serves as discharge control means for controlling the second transistor such that the length of time during which the element P is discharged in the present activation cycle of the print wire 38 to form a dot in the present printing position is longer where the distance between the present printing position and the position in which a next dot is formed in the next activation cycle of the same print wire 38 is larger than a predetermined multiple of the predetermined printing pitch, than where the distance is not larger than the predetermined multiple of the printing pitch.

Although the present embodiment is adapted such that the second transistor TR2 is held on to rapidly discharge the piezoelectric element P where a dot is to be formed at the next print position while the transistor TR2 is alternately turned on and off to slowly discharge the element P where a dot is not to be formed at the next printing position, it is possible that the transistors TR2 is alternately turned on and off in both cases, such that the "on" time is shorter in the latter case (for slowly discharging the element P) than in the former case.

In the above modified arrangement, there arises no problem even if the moment at which the discharging of the element P is completed by holding the transistor TR2 in the off state deviates from the moment at which the releasing of the energy from the element P is actually completed. Described specifically, the amount of energy stored in the coil L and returned to the power source E during the on-off operation of the transistor TR2 is considerably smaller than the amount of energy which is released at one time from the element P and stored in the coil L. Therefore, such a small amount of energy left in the coil L in the above modified arrangement may not affect the next charging cycle of the piezoelectric element P for the next activation cycle of the print wire 38. In this respect, it is not essential to detect the voltage $V_P$ to confirm the actual zeroing of the voltage $V_P$ to start holding the transistor TR2 in its off state. This means that a voltage detector to monitor the voltage $V_P$ is not essential, and the cost of the printer may be accordingly reduced.

Figure 13:
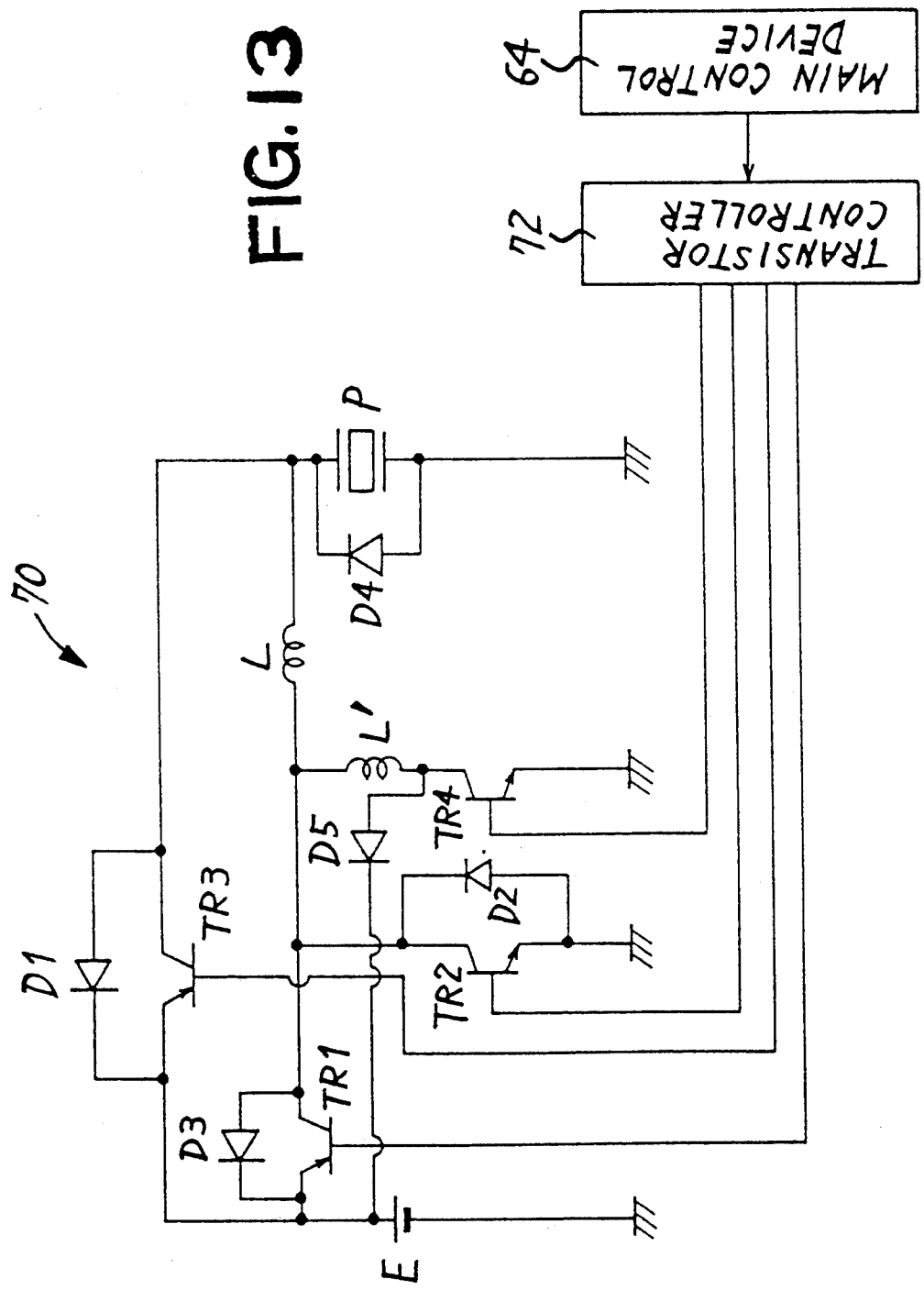
FIGS. 13 and 14 are diagrams showing yet further embodiments of the invention.

Referring to FIG. 13, there is shown a further modified embodiment of the invention, wherein a driver circuit 70 is provided for activating the piezoelectric element P. The driver circuit 70 is different from the driver circuit 60 of FIG. 10, in that a second coil L' and a fourth transistor TR4 in series connection with each other are connected in parallel to the second transistor TR2. The fourth transistor TR4 allows a flow of an electric current therethrough in the direction from the second coil L' toward the ground to which the transistor TR4 is connected. Further, the driver circuit 70 has a fifth diode D5 which is connected between the positive terminal of the power source E, and one of opposite ends of the second coil L' which is connected to the fourth transistor TR4. The fifth diode D5 allows an electric current to flow therethrough in the direction from the second coil L' toward the positive terminal of the power source E. The first through fourth transistors TR1'TR4 are controlled by a transistor controller 72 connected to the main control device 64.

The driver circuit 70 is operated in the same manner as the driver circuit 60, when the piezoelectric element P is charged, and when the element P is discharged while the extended-discharge command is not generated by the main control device 64. There will be described in detail an operation of the driver circuit 70 when the element P is discharged according to the extended-discharge command.

When a predetermined time has passed after the drive command is received, the controller 72 turns on the fourth transistor TR4, rather than the second transistor TR2. Consequently, there is formed a closed path which includes the element P, first and second coils L and L' and fourth transistor TR4, whereby the energy released from the element P is transferred to both the first coil L and the second coil L'. As a result, the voltage $V_P$ of the element P is lowered to zero in a discharging time which is determined by the equivalent capacitance of the element P and the reactance values of the first and second coils L and L'. Where the element P is discharged according to the extended-discharge command, the second coil L' is effectively added to the discharging circuit, in series connection with the first coil L, whereby the discharging rate of the element P is made lower than that where the discharging is normally effected with the second transistor TR2 turned on in the absence of the extended-discharge command. After the element P is completely discharged, the controller 72 turns off the fourth transistor TR4, so as to form a closed path which includes the two coils L, L', fifth diode D5, power source E and fourth diode D4. As a consequence, the energies stored in the two coils L, L' are returned to the power source E.

It will be understood from the above description of the embodiment of FIG. 13 that the main control device 64 which generates the extended-discharge command depending upon the printing data is considered to constitute the discharge control means for selectively effecting the slow discharging or rapid discharging, depending upon whether a dot is to be formed at the next printing position or not. More precisely, the discharge control means is considered to be constituted by the coils L, L', second and fourth transistors TR2, TR4, diodes D3, D5, a portion of the main control device 64 assigned to generate the extended-discharge command according to the printing data, and a portion of the controller 72 assigned to control the transistors TR2, TR4 according to the extended-discharge command. However, the means for effecting the slow discharging of the element P where a dot is not to be formed at the next printing position may be considered to be constituted by the second coil L', fifth diode D5, fourth transistor TR4, a portion of the main control device 64 assigned to generate the extended-discharge command depending upon the printing data, and a portion of the controller 72 assigned to control the fourth transistor TR4 according to the extended-discharge command. Further, the means for effecting the rapid discharging of the element P where a dot is to be formed at the next printing position may be considered to be constituted by the first coil L, third diode D3, second transistor TR2, a portion of the main control device 64 assigned to generate the extended-discharge command depending upon the printing data, and a portion of the controller 72 assigned to control the second transistor TR2 in the absence of the extended-discharge command.

Each driver circuit 70 shown in FIG. 13 used for each of the print wires 38 has an extended-discharge circuit which consists of the second coil L', fourth transistor TR4 and fifth diode D5. However, one extended-discharge circuit may be used commonly for a plurality of driver circuits 92 (first to m-th circuits), as illustrated in FIG. 14, wherein the extended-discharge circuit is indicated at 90.

Figure 14:
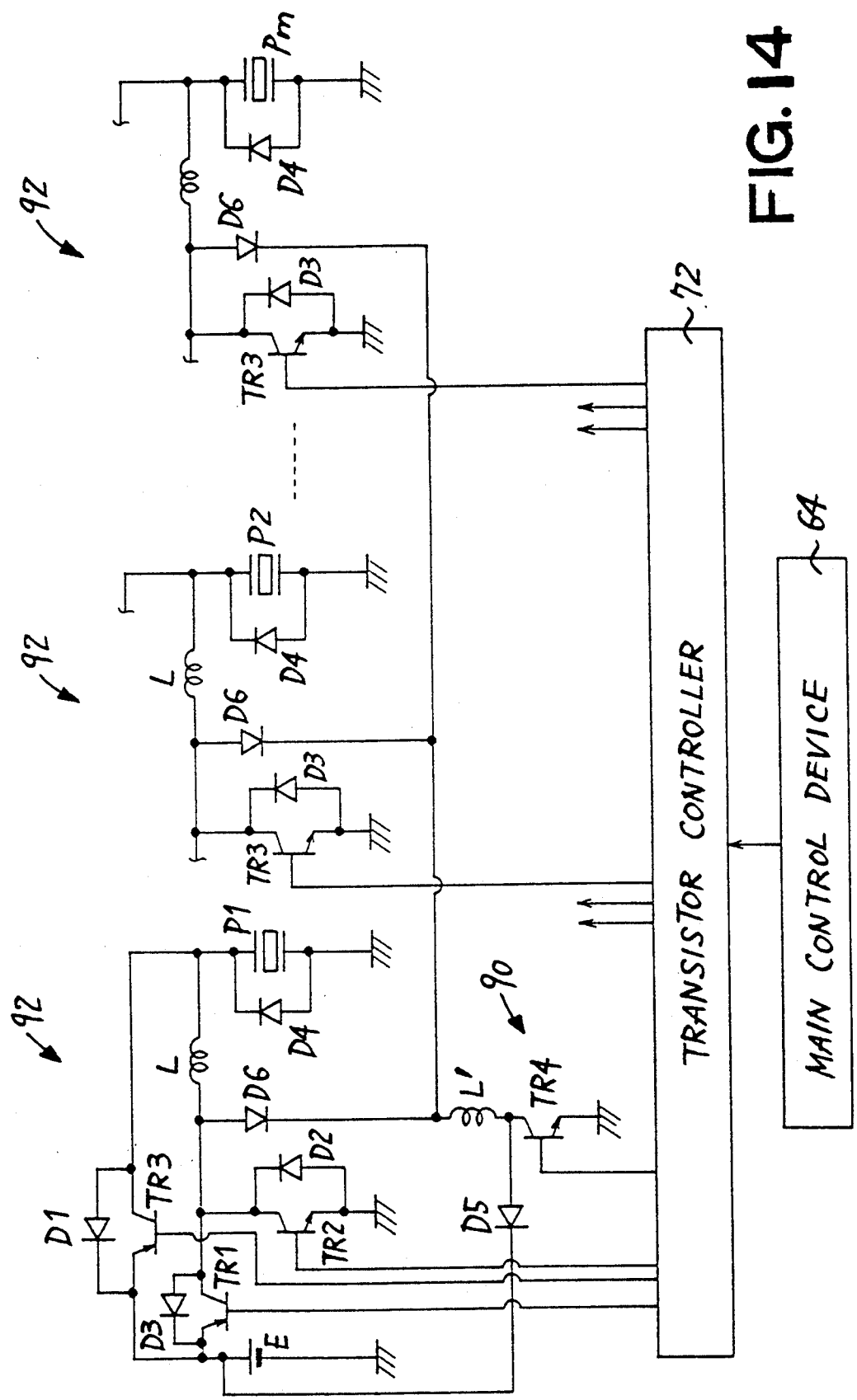

In the embodiment of FIG. 14, the required discharging time increases with an increase in the number of the piezoelectric elements P that should be discharged slowly (with an increase in the number of the driver circuits 92 which are operated according to the extended-discharge commands), since the amount of energy to be stored in the common coil L' accordingly increases. In view of this fact, the capacities of the two coils L, L' and the printing pitch are determined so as to avoid formation of a dot by a rebounding motion of the print wire 38 even if only one element P corresponding to that print wire 38 is slowly discharged (even if the time of the discharging according to an extended-discharge command is the shortest), and so as to complete the slow discharging of all the elements P before the operation to form dots at the next printing position is commenced. In the embodiment of FIG. 14, a sixth diode D6 is provided between the coil L of each driver circuit 92 and the extended-discharge circuit 90, in order to protect each driver circuit 92 from an electric current flowing from the other circuits 92.

It will be understood that the discharge control means in the present embodiment is also principally constituted by the main control device 64. Precisely, however, the discharge control means is constituted by the sixth diode D6, extended-discharge circuit 90, a portion of the main control device 64 assigned to generate the extended-discharge command depending upon the printing data, and a portion of the controller 72 assigned to control the fourth transistor TR4 according to the extended-discharge command.

While the print head 2 of the dot-matrix printers described above has a piezoelectric actuator (piezoelectric members one of which is indicated at 10 in FIG. 2), the principle of the present invention is applicable to a print head which utilizes solenoid coils for activating the print wires, a dot-matrix printer having such a print head, and a driver circuit for controlling such solenoid coils.

Figure 15:
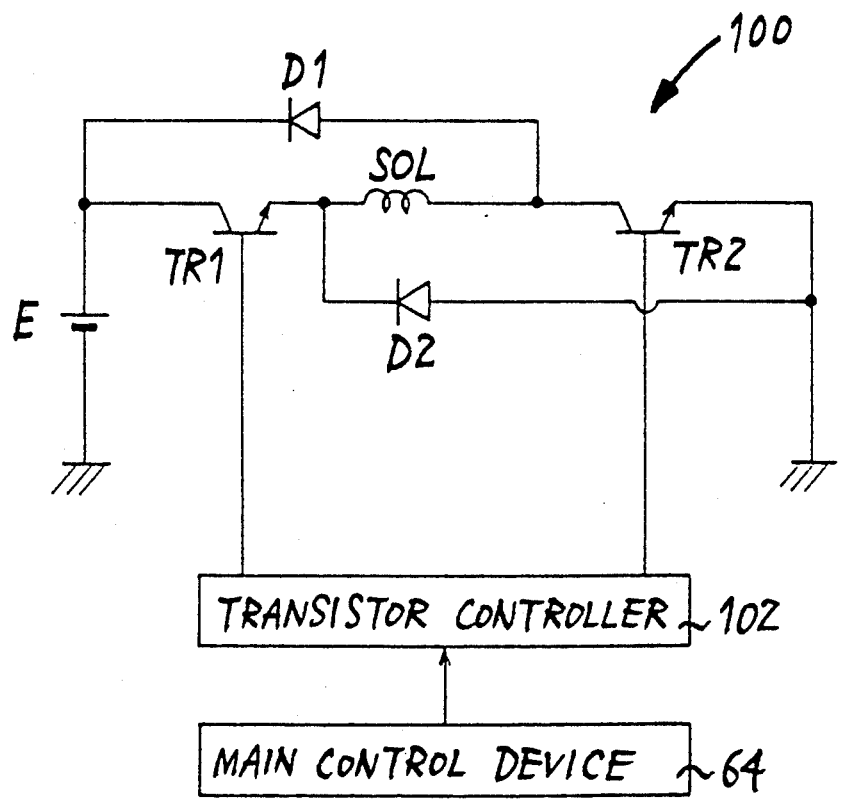
FIG. 15 is a diagram showing a driver circuit for driving a solenoid coil used as an actuator in a dot-matrix print head according to a still further embodiment of the invention.

An example of a driver circuit for driving a solenoid coil is indicated at 100 in FIG. 15, wherein the DC power source E, first transistor TR1, solenoid coil SOL and second transistor TR2 are connected in series to each other. The transistors TR1, TR2 both allow an electric current to flow therethrough in the direction from the positive terminal of the power source E toward the solenoid coil SOL. The first diode D1 is connected in parallel to the series connection of the solenoid coil SOL and the second transistor TR2, such that the first diode D1 allows an electric current to flow therethrough in the direction from the coil SOL toward the positive terminal of the power source E. Further, the second diode D2 is connected in parallel to the series connection of the coil SOL and the first transistor TR1, such that the second diode D2 allows an electric current to flow therethrough in the direction opposite to the current flow direction of the second transistor TR2.

The first and second transistors TR1 and TR2 of the driver circuit 100 are controlled by a transistor controller 102. The transistors TR1 and TR2 are normally placed in the off state. In response to a drive command from the main control device 64, the controller 102 turns on both of the transistors TR1, TR2. Consequently, the line voltage $V_E$ of the power source E is applied to the solenoid coil SOL, and the corresponding print wire 38 is advanced based on a magnetic force produced as a result of energization of the coil SOL, whereby the print wire 38 is forced against the recording medium 6. The mechanism to force the print wire 38 against the medium 6 will be understood from the discussion of the prior art in the introductory part of the specification.

When a suitable time has passed after the drive command is received, the controller 102 deenergizes the solenoid coil SOL. The manner of deenergizing the coil SOL differs depending upon whether the extended-discharge command is received from the main control device 64, or not. In the case where the extended-discharge command is not received, the controller 102 holds the transistors TR1 and TR2 in the off state, whereby there is formed a closed path which includes the first diode D1, power source E and second diode D2. As a result, the energy of the coil SOL is returned to the power source E, and the coil SOL is rapidly brought to its fully deenergized or discharged state. The duration for which the transistor TR2 is held off is determined to be sufficient for the energy of the coil SOL to be completely released. In this case, the print wire 38 is rapidly returned to its fully retracted position.

Where the coil SOL is deenergized in the presence of the extended-discharge command, the controller 102 holds the first transistor TR1 in the off state, while alternately turning on and off the second transistor TR2 at a predetermined frequency. Therefore, the energy of the coil SOL is returned to the power source E at a lower rate than in the case where the deenergization is effected with the second transistor TR2 held off. That is, the magnetic force of the solenoid coil SOL is slowly reduced, and the print wire 38 is accordingly slowly returned to the fully retracted position. Thus, the print wire 38 is prevented from rebounding to such an extent that causes a dot to be formed at a position not designated by the printing data.

It will be understood from the above description of the driver circuit 100 that the discharge or deenergization control means for the solenoid coil SOL is constituted by the transistor TR2, a portion of the main control unit 64 assigned to generate the extended-discharge command depending upon the printing data, and a portion of the controller 102 assigned to control the transistor TR2 according to the extended-discharge command.

While the presently preferred embodiments of the present invention have been described in detail referring to the accompanying drawings, it is to be understood that the invention is not limited to the details of the illustrated embodiments, and that the invention may be embodied with various changes, modifications and improvements which may occur to those skilled in the art, without departing from the spirit and scope of the invention defined in the following claims.

What is claimed is:

1. A driver circuit for driving a piezoelectric element, including a charging circuit having a DC power source and a coil which are connected in series to the piezoelectric element for charging the piezoelectric element, and a discharging circuit for allowing said piezoelectric element to be discharged, said driver circuit comprising:

first conditioning means provided in said charging circuit, and having an original state for inhibiting said piezoelectric element from being charged, and a charging state for allowing said piezoelectric element to be charged, said first conditioning means being normally placed in said original state, and brought into said charging state upon generation of a drive command to activate said piezoelectric element, said first conditioning means being returned to said original state at a first point of time a predetermined time after a voltage of said piezoelectric element has reached a predetermined level not higher than a line voltage of said power source;

second conditioning means provided in said discharging circuit, and having an original state for inhibiting said piezoelectric element from being discharged, and a discharging state for allowing said piezoelectric element to be discharged, said second conditioning means being normally placed in said original state thereof, and brought into said discharging state thereof at one of said first point of time and a second point of time a predetermined time after said first point, said second conditioning means being returned to said original state thereof by the time when said first conditioning means is placed in said charging state thereof for a next activation of said piezoelectric element; and voltage limiting means for providing a flow of an electric current in a direction from said coil toward said power source only after said voltage of the piezoelectric element has reached said predetermined level, thereby preventing said piezoelectric element from receiving an excessive electric energy that causes said voltage of the piezoelectric element to exceed said predetermined level, and thereby limiting said voltage of the piezoelectric element to said predetermined level, said voltage limiting means further providing a flow of the electric current in a direction from said coil toward said piezoelectric element, to thereby permit an energy stored in said coil to be supplied to said piezoelectric element when said voltage of said element falls below said predetermined level while said first conditioning means is placed in said original state.

2. A driver circuit according to claim 1, wherein said first conditioning means comprises first switching means connected in series to said charging circuit, and first switching control means for controlling said first switching means in response to said drive command, and said second conditioning means comprises second switching means connected in series to said discharging circuit, and second switching control means for controlling said second switching means, and wherein said voltage limiting means comprises a closed by-pass circuit which by-passes said first switching means and includes said DC power source, said coil, and checking means connected in series to said power source and said coil, said checking means allowing a flow of an electric current in a direction from said coil toward a positive terminal of said power source, and inhibiting a flow of the electric current in a direction opposite to said direction.

3. A driver circuit according to claim 2, wherein after said first switching control means has turned off said first switching means after a first charging time, said first switching control means turns on said first switching means for charging again said piezoelectric element for a second charging time before said second switching control means turns on said second switching means.

4. A driver circuit according to claim 2, wherein said first switching control means holds said first switching means in an on state, to thereby hold said first conditioning means in said charging state, until said second switching control means turns on said second switching means.

5. A driver circuit according to claim 2, wherein said first switching means comprises a first transistor connected between said positive terminal of said power source and said coil and inhibiting a flow of an electric current in a direction from said coil toward said positive terminal, said discharging circuit comprising a path which branches from a part of said charging circuit between said coil and a positive terminal of the piezoelectric element and which is connected to a negative terminal of the piezoelectric element, said path having energy consuming means, said second switching means comprising a second transistor connected to said path such that said second transistor inhibits a flow of an electric current from said negative terminal of the piezoelectric element toward said positive terminal of the element, and wherein said voltage limiting means comprises a first diode provided in said charging circuit such that said first diode is parallel to said first transistor and said coil, and further comprises a second diode provided between a part of said charging circuit between said first transistor and said coil, and said negative terminal of said power source.

6. A driver circuit according to claim 5, wherein said first conditioning means further comprises a third transistor connected in parallel to said first diode, and third switching control means for controlling said third transistor, and wherein at a moment when said first switching control means turns off said first transistor after a first charging time, said third switching control means turns on said third transistor for a second charging time before said second switching control means turns on said second transistor.

7. A driver system comprising a plurality of driver circuits which are operable to drive respective piezoelectric elements independently of each other, each driver circuit including:

a charging circuit having a DC power source and a coil which are connected in series to a piezoelectric element for charging the piezoelectric element, and a discharging circuit for allowing said piezoelectric element to be discharged;

first conditioning means providing in said charging circuit, and having an original state for inhibiting said piezoelectric element from being charged, and a charging state for allowing said piezoelectric element to be charged, said first conditioning means being normally placed in said original state, and brought into said charging state upon generation of a drive command to activate said piezoelectric element, said first conditioning means being returned to said original state at a first point of time a predetermined time after a voltage of said piezoelectric element has reached a predetermined level not higher than a line voltage of said power source, said first conditioning means including, first switching means connected in series to said charging circuit, and first switching control means for controlling said first switching means in response to said drive command, second conditioning means provided in said discharging circuit, and having an original state for inhibiting said piezoelectric element from being discharged, and a discharging state for allowing said piezoelectric element to be discharged, said second conditioning means being normally placed in said original state thereof, and brought into said discharging state thereof at one of said first point of time and a second point of time a predetermined time after said first point, said second conditioning means being returned to said original state thereof by the time when said first conditioning means is placed in said charging state thereof for a next activation of said piezoelectric element, said second conditioning means including second switching means connected in series to said discharging circuit, and second switching control means for controlling said second switching means, voltage limiting means for preventing said piezoelectric element from receiving an excessive electric energy that causes said voltage of the piezoelectric element to exceed said predetermined level, and thereby limiting said voltage of the piezoelectric element to said predetermined level, said voltage limiting means including a closed by-pass circuit which by-passes said first switching means and includes said DC power source, said coil, and checking means connected in series to said power source and said coil, said checking means allowing a flow of an electric current in a direction from said coil toward a positive terminal of said power source, and inhibiting a flow of the electric current in a direction opposite to said direction, said first switching means comprising a first transistor connected between said positive terminal of said power source and said coil and inhibiting a flow of an electric current in a direction from said coil toward said positive terminal, said discharging circuit comprising a path which branches from a part of said charging circuit between said first transistor and said coil and which is connected to a negative terminal of the piezoelectric element, said second switching means comprising a second transistor connected to said path such that said second transistor inhibits a flow of an electric current from said negative terminal of the piezoelectric element toward said positive terminal of the element, said voltage limiting means comprising a first diode provided in said charging circuit such that said first diode parallel to said first transistor and said coil and allows said flow of an electric current from said coil toward said positive terminal of said power source, and further comprising a second diode connected in parallel to said second transistor and allowing a flow of an electric current from a negative terminal of said power source toward said positive terminal of the power source via said coil, said second conditioning means comprising a second discharging circuit distinguished from said discharging circuit provided as a first discharging circuit, said second discharging circuit being connected in parallel to said second transistor and having a second coil distinguished from said coil provided as a first coil, and a fourth transistor connected in a series to said second coil, said driver circuits having a common said second discharging circuit.

8. A dot-matrix printer comprising:

a print head comprising a piezoelectric actuator consisting of a plurality of piezoelectric elements superposed on each other, and a print wire activated by said piezoelectric actuator to effect printing due to pressing contact of said print wire with a recording medium;

a driver circuit for driving each of said plurality of piezoelectric elements of said print head, said driver circuit including (a) a charging circuit having a DC power source and a coil which are connected in series to each said piezoelectric element, (b) a discharging circuit for discharging said piezoelectric element, (c) first conditioning means provided in said charging circuit, and having an original state for inhibiting each said piezoelectric element from being charged, and a charging state for charging each said piezoelectric element, said first conditioning means being normally placed in said original state, and brought into said charging state upon generation of a drive command to activate said each piezoelectric element, said first conditioning means being returned to said original state at a first point of time a predetermined time after a voltage of each said piezoelectric element has reached a predetermined level not higher than a line voltage of said power source, (d) second conditioning means provided in said discharging circuit, and having an original state for inhibiting each said piezoelectric element from being discharged, and a discharging state for discharging each said piezoelectric element, said second conditioning means being normally placed in said original state thereof, and brought into said discharging state thereof at one of said first point of time and a second point of time a predetermined time after said first point, said second conditioning means being returned to said original state thereof by the time when said first conditioning means is placed in said charging state thereof for a next activation of said piezoelectric element, and (e) voltage limiting means for providing a flow of an electric current in a direction from each coil toward said power source only after said voltage of each said piezoelectric element has reached said predetermined level, thereby preventing each said piezoelectric element from receiving an excessive electric energy that causes said voltage of the piezoelectric element to exceed said predetermined level, and thereby limiting said voltage of the piezoelectric element to said predetermined level, said voltage limiting means further providing a flow of the electric current in a direction only from said coil toward said piezoelectric element, to thereby permit an energy stored in said coil to be supplied to said piezoelectric element when said voltage of said element falls below said predetermined level while said first conditioning means is placed in said original state;

a feeding device for effecting a relative movement between said print head and said recording medium;

printing control means for applying said drive command to first conditioning means as a printing command to form a dot at one of predetermined printing positions which are spaced apart from each other at a predetermined printing pitch in a direction of said relative movement; and discharge control means for controlling said second conditioning means such that a length of time during which each said piezoelectric element is discharged in a present activating cycle of said print wire to form a dot at a present one of said printing positions is longer where a distance between said present printing position and the position at which a next dot is formed in a next activation cycle of said print wire is larger than a predetermined multiple of said printing pitch, than where said distance is not larger than said predetermined multiple.

9. A dot-matrix printer comprising:

a print head having an actuator such as a piezoelectric element and a solid coil for operating a print wire by application and removal of an electric energy to and from said actuator, to form dots on a recording medium;

a feeding device for effecting a relative movement between said print head and the recording medium;

actuator control device responsive to printing data, said actuator control having means for controlling said actuator to move said print wire between a printing position in which said print wire is pressed against said recording medium to form a dot at one of predetermined printing positions which are spaced apart from each other at a predetermined pitch in a direction of said relative movement, and a non-printing position in which the print wire is spaced away from the recording medium, said print wire being moved to said printing position by one of application and removal of an electric energy to and from said actuator, and returned to said non-printing position by the other of said application and said removal of said electric energy; and discharge control means for varying a length of time during which said other of said application and said removal of said electric energy is effected, said discharge control means controlling said actuator control device such that said length of time is longer when a distance between said printing position and a position at which a next not is formed in a next operation cycle of the print wire is larger than a predetermined multiple of said printing pitch, than when said distance is not larger than said predetermined multiple.

10. A dot-matrix printer according to claim 9, wherein said actuator includes a piezoelectric element, and said actuator control device comprises:

a charging circuit having a DC power source, first switching means and a coil which are connected in series to the piezoelectric element for charging the piezoelectric element;

a discharging circuit having second switching means for allowing said piezoelectric element to be discharged;

first switching control means for controlling said first switching means such that said first switching means is normally placed in an original state thereof for inhibiting said piezoelectric element from being charged, and is brought into a charging state thereof for allowing said piezoelectric element to be charged, upon generation of a drive command of said printing data, said first switching control means returning said first switching means to said original state at a first point of time a predetermined time after a voltage of said piezoelectric element has reached a predetermined level not higher than a line voltage of said power source;

second switching control means for controlling said second switching means such that said second switching means is normally placed in an original state thereof for inhibiting said piezoelectric element from being discharged, and brought into a discharging state thereof for allowing said piezoelectric element to be discharged at one of said first point of time and a second point of time a predetermined time after said first point, said second switching control means returning said second switching means to said original state by the time when said first switching means is placed in said charging state thereof in said next operation cycle of said print wire; and voltage limiting means for preventing said piezoelectric element from receiving an excessive electric energy that causes said voltage of the piezoelectric element to exceed said predetermined level, and thereby limiting said voltage of the piezoelectric element to said predetermined level.

11. A dot-matrix printer according to claim 10, wherein said discharge control means controls said second switching control means such that said second switching means is placed alternately in said discharging state and said original state, where said distance between said present printing position and the position in which said next dot is formed is larger than said predetermined multiple of said predetermined printing pitch.

12. A dot-matrix printer according to claim 10, wherein said discharge control means controls said second switching control means such that said second switching means is placed in alternately in said discharging state and said original state, such that a time during which said second switch means is placed in said original state is longer where said distance between said present printing position and the position in which said next dot is formed is larger than said predetermined multiple of said predetermined printing pitch.

13. A dot-matrix printer according to claim 9, wherein said actuator comprises a solenoid coil, and said actuator control device comprises a charging circuit having a DC power source, first switching means said solenoid coil and second switching means which are connected in series to each other in order of description, for charging said solenoid coil, and a discharging circuit having checking means which is connected in series to said solenoid coil and said power source such that said checking means inhibits a flow of an electric current in a direction from a positive terminal of said power source toward a negative terminal of the power source, and allows a flow of an electric current in a direction opposite to said direction, said discharging circuit allowing said solenoid coil to be discharged toward said power source when said first switching means and said second switching means are turned off, and wherein said discharge control means comprises second switching control means which controls said second switching means such that said second switching means is held off where said distance between said present printing position and the position in which said next dot is formed is not larger than said predetermined multiple of said predetermined printing pitch, and such that said second switching means is alternately placed on and off where said distance is larger than said predetermined multiple.

14. A driver circuit for driving a piezoelectric element, including a charging circuit having a DC power source and a coil which are connected in series to the piezoelectric element for charging the piezoelectric element, and a discharging circuit for discharging said piezoelectric element, said driver circuit comprising:

a first transistor connected in series to said charging circuit, between a positive terminal of said power source and said coil and inhibiting a flow of an electric current in a direction from said coil toward said positive terminal;

first switching control means for normally placing said first transistor in an original state for inhibiting said piezoelectric element from being charged, and bringing said first transistor into a charging state for charging said piezoelectric element, in response to a drive command to activate said piezoelectric element, said first switching control means returning said first transistor to said original state at a first point of time a predetermined time after a voltage of said piezoelectric element has reached a predetermined level not higher than a line voltage of said power source;

a second transistor connected to a path of said discharging circuit, which branches from a part of said charging circuit between said first transistor and said coil and which is connected to a negative terminal of said piezoelectric element, said second transistor inhibiting a flow of an electric current from said negative terminal toward a positive terminal of the piezoelectric element;

second switching control means for normally placing said second transistor in an original state for inhibiting said piezoelectric element from being discharged, and bringing said second transistor into a discharging state for discharging said piezoelectric element, at one of said first point of time and a second point of time a predetermined time after said first point, said second switching control means returning said second transistor to said original state by the time when said first transistor is placed in said charging state for a next activation of said piezoelectric element;

a first diode provided in said charging circuit such that said first diode is parallel to said first transistor and said coil, said first diode inhibiting a flow of an electric current in a direction from said positive terminal of said power source toward said coil, and providing a flow of the electric current only from said coil toward said positive terminal of the power source to thereby prevent said piezoelectric element from receiving an excessive electric energy that causes the voltage of said piezoelectric element to exceed said predetermined level; and a second diode connected in parallel to said second transistor, and providing a flow of the electric current only from a negative terminal of the power source toward said positive terminal of the power source via said coil, to thereby return an energy stored in said coil to said power source while said first transistor is placed in said original state.

15. A driver circuit according to claim 14, wherein said first conditioning means further comprises a third transistor connected in parallel to said first diode, third switching control means for controlling said third transistor, and a protector provided in a closed path which includes said power source, said third transistor and said piezoelectric element, said protector being turned off to disconnect said closed path when an electric current which flows through said first transistor when said first transistor is on is applied to said protector.

16. A driver circuit according to claim 14, wherein said first conditioning means further comprises a third transistor connected in parallel to said first diode, third switching control means for controlling said third transistor, and voltage detecting means connected to said piezoelectric element and said first and second switching control means, for detecting at least one of said predetermined level and a zero level of said voltage of the piezoelectric element, thereby detecting said first point of time and commanding said first switching control means to turn off said first transistor at said first point of time, and/or detecting a point of time at which said voltage of said piezoelectric element is zeroed and commanding said second switching control means to turn off said second transistor.

17. A driver circuit according to claim 14, wherein said discharging circuit further comprises a third diode connected in parallel to said first transistor and allowing said flow of an electric current from said coil toward said positive terminal of said power source, and a fourth diode connected in parallel to said piezoelectric element and allowing a flow of an electric current from negative terminal of the piezoelectric element toward said positive terminal of the element.

18. A driver circuit according to claim 14, wherein said first conditioning means further comprises a third transistor connected in parallel to said first transistor, and third switching means for controlling said third transistor, and wherein at a moment when said first switching control means turns off said first transistor after a first charging time, said third switching control means turns on said third transistor for a second charging time before said second switching control means turns on said second transistor.

19. A driver circuit according to claim 14, wherein said second conditioning means further comprises a second discharging circuit distinguished from said discharging circuit provided as a first discharging circuit, said second discharging circuit which is connected in parallel to said second transistor and which has a second coil distinguished from said coil provided as a first coil, and a fourth transistor connected in series to said second coil.

20. A dot-matrix printer comprising:
a print head having a piezoelectric element for operating a print wire between a printing position and a non-printing position, by application and removal of an electric energy to and from said piezoelectric element, to form dots on a recording medium;

a feeding device for effective a relative movement between said print head and the recording medium;

a charging circuit having a DC power source, a first transistor and a coil which are connected in series to the piezoelectric element for charging the piezoelectric element, said first transistor being provided between a positive terminal of said power source and said coil, and inhibiting a flow of an electric current in a direction from said coil toward said positive terminal a discharging circuit having a second transistor for discharging said piezoelectric element, said second transistor being connected to a path which branches from a part of said charging circuit between said first transistor and said coil and which is connected to a negative terminal of said piezoelectric element, said second transistor inhibiting a flow of an electric current from said negative terminal toward a positive terminal of the piezoelectric element;

first switching control means for normally placing said first transistor in an original state for inhibiting said piezoelectric element from being charged, and bringing said first transistor into a charging state for charging said piezoelectric element, in response to a drive command to activate and piezoelectric element, said first switching control means returning said first transistor to said original state at a first point of time a predetermined time after a voltage of said piezoelectric element has reached a predetermined level not higher than a line voltage of said power source;

second switching control means for normally placing said second transistor in an original state for inhibiting said piezoelectric element from being discharged, and bringing said discharging said piezoelectric element, at one of said first point of time and a second point of time a predetermined time after said first point, said second switching control means returning said second transistor to said original state by the time when said first transistor is placed in said charging state for a next activation of said piezoelectric element;

a first diode provided in said charging circuit such that said first diode is parallel to said first transistor and said coil, said first diode inhibiting a flow of an electric current in a direction from said positive terminal of said power source toward said coil, and providing a flow of the electric current only from said coil toward said positive terminal of the power source to thereby prevent said piezoelectric element from receiving an excessive electric energy that causes the voltage of said piezoelectric element to exceed said predetermined level; and a second diode connected in parallel to said second transistor, and providing a flow of the electric currently only from a negative terminal of the power source toward said positive terminal of the power source via said coil, to thereby return an energy stored in said coil to said power source while said first transistor is placed in said original state.

* * * * *